(12) United States Patent
Jung et al.

(10) Patent No.: US 9,093,652 B2
(45) Date of Patent: Jul. 28, 2015

(54) COMPOUND FOR AN ORGANIC PHOTOELECTRIC DEVICE, ORGANIC PHOTOELECTRIC DEVICE INCLUDING THE SAME, AND DISPLAY DEVICE INCLUDING THE ORGANIC PHOTOELECTRIC DEVICE

(75) Inventors: Sung-Hyun Jung, Uiwang-si (KR);
Myeong-Soon Kang, Uiwang-si (KR);
Ho-Kuk Jung, Uiwang-si (KR);
Nam-Soo Kim, Uiwang-si (KR);
Nam-Heon Lee, Uiwang-si (KR);
Eui-Su Kang, Uiwang-si (KR);
Dong-Min Kang, Uiwang-si (KR);
Mi-Young Chae, Uiwang-si (KR)

(73) Assignee: CHEIL INDUSTRIES, INC., Gumi-si, Kyeongsandbuk-do (KR)

( * ) Notice: Subject to any disclaimer, the term of this patent is extended or adjusted under 35 U.S.C. 154(b) by 40 days.

(21) Appl. No.: 13/525,766

(22) Filed: Jun. 18, 2012

(65) Prior Publication Data
US 2012/0256174 A1 Oct. 11, 2012

Related U.S. Application Data

(63) Continuation of application No. PCT/KR2010/007059, filed on Oct. 14, 2010.

(30) Foreign Application Priority Data

Dec. 16, 2009 (KR) ................ 10-2009-0125506

(51) Int. Cl.
| | | |
|---|---|---|
| *C07D 401/10* | (2006.01) | |
| *H01L 51/46* | (2006.01) | |
| *H01L 51/54* | (2006.01) | |
| *C07D 403/10* | (2006.01) | |
| *H01L 51/00* | (2006.01) | |
| *C09K 11/06* | (2006.01) | |
| *H05B 33/10* | (2006.01) | |
| *C09B 57/00* | (2006.01) | |

(52) U.S. Cl.
CPC ............ *H01L 51/0067* (2013.01); *C09B 57/00* (2013.01); *C09K 11/06* (2013.01); *H05B 33/10* (2013.01); *C09K 2211/1007* (2013.01); *C09K 2211/1011* (2013.01); *C09K 2211/1029* (2013.01); *C09K 2211/1044* (2013.01); *C09K 2211/1059* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2005/0064237 A1* | 3/2005 | Kato et al. | 428/690 |
| 2007/0257600 A1 | 11/2007 | Matsuura et al. | |
| 2008/0199726 A1 | 8/2008 | Schafer et al. | |
| 2009/0289224 A1 | 11/2009 | Liang et al. | |
| 2009/0289547 A1 | 11/2009 | Ye et al. | |

FOREIGN PATENT DOCUMENTS

| | | | |
|---|---|---|---|
| JP | 2002-324678 A | | 11/2002 |
| JP | 2004-022334 A | | 1/2004 |
| JP | 2004-031004 A | | 1/2004 |
| JP | 2004-078016 A | | 3/2004 |
| JP | 2004-253298 A | | 9/2004 |
| JP | 2007-015993 A | | 1/2007 |
| JP | 2008-280330 A | | 11/2008 |
| JP | 2009-126792 A | | 6/2009 |
| JP | 2009-126793 A | | 6/2009 |
| JP | 2009-184987 A | | 8/2009 |
| JP | 2009184987 A | * | 8/2009 |
| KR | 10 2006-0021143 A | | 3/2006 |
| KR | 10 2007-0030759 A | | 3/2007 |
| KR | 10-2009-0008737 A | | 1/2009 |
| KR | 10 2009-0008737 A | | 1/2009 |
| WO | WO-2005/022962 A1 | | 3/2005 |
| WO | WO 2005/105950 A1 | | 11/2005 |
| WO | WO 2009/142867 A1 | | 11/2009 |
| WO | WO-2010/021689 A1 | | 2/2010 |

OTHER PUBLICATIONS

Machine English translation of JP 2009-184987 A. Jun. 13, 2013.*
Machine English translation of KR 10-2009-0008737 A. Jun. 13, 2013.*
Tang, et al.; Organic electroluminescent diodes; Applied Physics Letters; Sep. 1987; pp. 913-915; 51 (12); American Institute of Physics; USA.
O'Brien, et al.; Improved energy transfer in electrophosphorescent devices; Applied Physics Letters; Jan. 18, 1999; pp. 442-444; vol. 74, No. 3; American Institute of Physics; USA.
Baldo, et al.; Very high-efficiency green organic light-emitting devices based on electrophosphorescence; Applied Physics Letters; Jul. 5, 1999; pp. 4-6; vol. 75, No. 1; American Institute of Physics; USA.
International Search Report in PCT/KR2010/007059, dated Aug. 1, 2011 (Jung, et al.).
May, F., et al., "Design Rules for Charge-Transport Efficient Host Materials for Phosphorescent Organic Light-Emitting Diodes," *Journal of the American Chemical Society*, 2012, vol. 134, No. 33, pp. 13818-13822.
J.A. Barth, et al., "Reactions of Acylium Salts with Aryl Nitriles. A Convenient Synthesis of Aryl Substituted Bis- and Tris- 1,3,5-Oxadiazinium Salts", Journal F. Prakt. Chemie. Band, vol. 333, No. 2, 1991, pp. 303-311.
Search Report mailed Mar. 13, 2014 in corresponding European Patent Application No. 10837767.2.

\* cited by examiner

*Primary Examiner* — J. L. Yang
(74) *Attorney, Agent, or Firm* — Lee & Morse, P.C.

(57) ABSTRACT

A compound for an organic photoelectric device, the compound being represented by Chemical Formula 1 or 2:

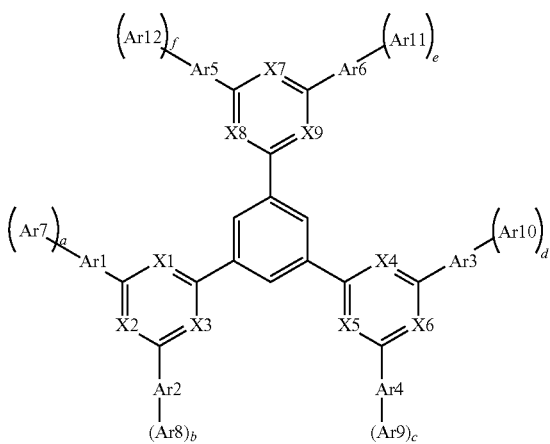

[Chemical Formula 1]

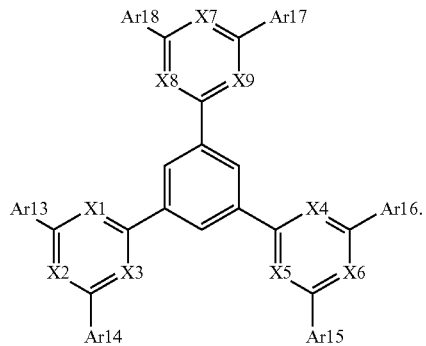

[Chemical Formula 2]

16 Claims, 3 Drawing Sheets

COMPOUND FOR AN ORGANIC PHOTOELECTRIC DEVICE, ORGANIC PHOTOELECTRIC DEVICE INCLUDING THE SAME, AND DISPLAY DEVICE INCLUDING THE ORGANIC PHOTOELECTRIC DEVICE

CROSS REFERENCE TO RELATED APPLICATION

This application is a continuation of pending International Application No. PCT/KR2010/007059, entitled, "Compound for an Organic Photoelectric Device and Organic Photoelectric Device," which was filed on Oct. 14, 2010, the entire contents of which are hereby incorporated by reference.

BACKGROUND

1. Field of the Invention

Embodiments relate to a compound for an organic photoelectric device, an organic photoelectric device including the same, and a display device including the organic photoelectric device.

2. Description of the Related Art

An organic photoelectric device may be a device for transforming photo-energy to electrical energy, or conversely, a device for transforming electrical energy to photo-energy. Two classes of organic photoelectric device may be established based on the manner in which the organic photoelectric device is driven. A first type of organic photoelectric device may be an electron device driven as follows: excitons may be generated in an organic material layer by photons from an external light source, the excitons may be separated into electrons and holes, and the electrons and holes may be transferred to different electrodes as a current and/or voltage source. A second type of organic photoelectric device may be an electron device driven as follows: a voltage or a current may be applied to at least two electrodes to inject holes and/or electrons into an organic material semiconductor positioned at an interface of the electrodes, the holes and electrons may combine to generate exitons having a high energy, the excitons may generate light while shifting to a ground state, and the device may be driven by the injected electrons and holes.

SUMMARY

Embodiments are directed to a compound for an organic photoelectric device, the compound being represented by Chemical Formula 1 or 2:

[Chemical Formula 1]

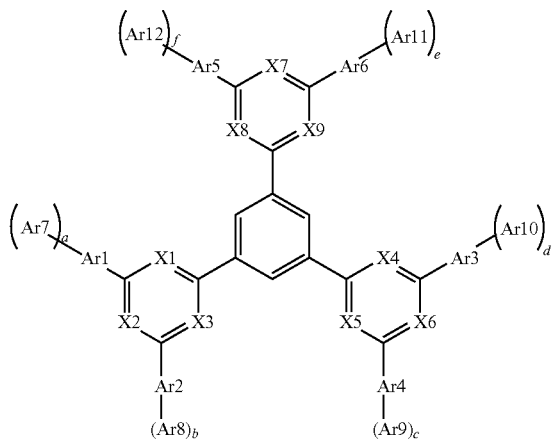

[Chemical Formula 2]

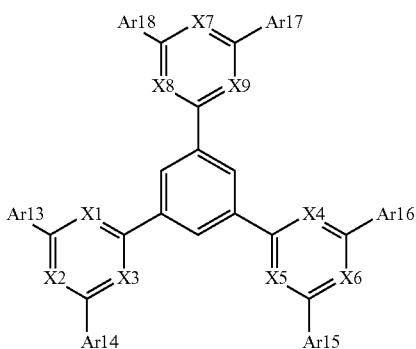

wherein, in Chemical Formulae 1 and 2, X1 to X9 are each independently a heteroatom or CR, wherein R is selected from the group of hydrogen, a C1 to C30 alkyl group, and a C6 to C30 aryl group, and at least two of X1 to X3 are a heteroatom, at least one of X4 to X6 is a heteroatom, and at least one of X7 to X9 is a heteroatom, wherein, in Chemical Formula 1, Ar1 to Ar6 are each independently selected from the group of a substituted or unsubstituted C6 to C30 arylene group, a substituted or unsubstituted C3 to C30 heteroarylene group, a substituted or unsubstituted C6 to C30 arylaminylene group, a substituted or unsubstituted carbazolylene group, and a substituted or unsubstituted fluorenylene group, Ar7 to Ar12 are each independently selected from the group of a substituted or unsubstituted C6 to C30 aryl group, and a substituted or unsubstituted C3 to C30 heteroaryl group, and a, b, c, d, e, and f are each independently an integer ranging from 1 to 2, and wherein, in Chemical Formula 2, Ar13 to Ar18 are each independently selected from the group of a substituted or unsubstituted C6 to C30 aryl group, a substituted or unsubstituted C3 to C30 heteroaryl group, a substituted or unsubstituted C6 to C30 arylamine group, a substituted or unsubstituted carbazolyl group, and a substituted or unsubstituted fluorenyl group.

At least two of X4 to X6 may be a heteroatom.

The compound represented by Chemical Formula 1 or 2 may be selected from the group of a compound where X2, X3, X5, X6, and X7 are heteroatoms, and the remainder of X1 to X9 are CR, and a compound where X2, X3, X5, X6, and X9 are heteroatoms, and the remainder of X1 to X9 are CR.

The compound represented by Chemical Formula 1 or 2 may be selected from the group of a compound where X2, X3, X5, X6, X7, and X9 are heteroatoms, and the remainder of X1 to X9 are CR, a compound where X2, X3, X5, X6, X8, and X9 are heteroatoms, and the remainder of X1 to X9 are C, a compound where X1, X3, X4, X5, X8, and X9 are heteroatoms, and the remainder of X1 to X9 are CR, and a compound where X1, X3, X4, X5, X7, and X9 are heteroatoms, and the remainder of X1 to X9 are CR.

The compound represented by Chemical Formula 1 or 2 may be selected from the group of a compound where X2, X6, X7, and X9 are heteroatoms, and the remainder of X1 to X9 are CR, and a compound where X3, X5, X7, and X9 are heteroatoms, and the remainder of X1 to X9 are CR.

The compound represented by Chemical Formula 1 or 2 may be selected from the group of a compound where X2, X6, X7, X8, and X9 are heteroatoms, and the remainder of X1 to X9 are CR, and a compound where X3, X5, X7, X8, and X9 are heteroatoms, and the remainder of X1 to X9 are CR.

The compound represented by Chemical Formula 1 or 2 may be a compound selected from the group of a compound where X2, X3, X5, X6, X7, X8, and X9 are heteroatoms, and the remainder of X1 to X9 are CR, and a compound where X1, X3, X4, X5, X7, X8, and X9 are heteroatoms, and the remainder of X1 to X9 are CR.

In Chemical Formula 1, Ar1 to Ar6 each independently may be selected from the group of a phenylene group, a biphenylene group, a terphenylene group, a stilbenzylene group, a naphthylene group, an anthracenylene group, a phenanthrenylene group, a pyrenylene group, and a perylenylene group, and Ar7 to Ar12 are each independently may be selected from the group of a phenyl group, a biphenyl group, a terphenyl group, a stilbenzyl group, a naphthyl group, an anthracenyl group, a phenanthrenyl group, a pyrenyl group, and a perylenyl group, and wherein, in Chemical Formula 2, Ar13 to Ar18 each independently may be selected from the group of a phenyl group, a biphenyl group, a terphenyl group, a stilbenzyl group, a naphthyl group, an anthracenyl group, a phenanthrenyl group, a pyrenyl group, and a perylenyl group.

In Chemical Formula 1, Ar7 to Ar12 each independently may be selected from the group of a thiophenyl group, a furanyl group, a pyrrolyl group, an imidazolyl group, a thiazolyl group, an oxazolyl group, an oxadiazolyl group, a triazolyl group, a pyridinyl group, a pyradazinyl group, a quinolinyl group, an isoquinolinyl group, an acridinyl group, an imidazopyridinyl group, an imidazopyrimidinyl group, a benzoquinolinyl group, and a phenanthrolinyl group, and in Chemical Formula 2, Ar13 to Ar18 each independently may be selected from the group of a thiophenyl group, a furanyl group, a pyrrolyl group, an imidazolyl group, a thiazolyl group, an oxazolyl group, an oxadiazolyl group, a triazolyl group, a pyridinyl group, a pyradazinyl group, a quinolinyl group, an isoquinolinyl group, an acridinyl group, an imidazopyridinyl group, an imidazopyrimidinyl group, a benzoquinolinyl group, and a phenanthrolinyl group.

Embodiments are also directed to a compound for an organic photoelectric device, the compound being represented by one of the following Chemical Formulae 3 to 33:

[Chemical Formula 3]

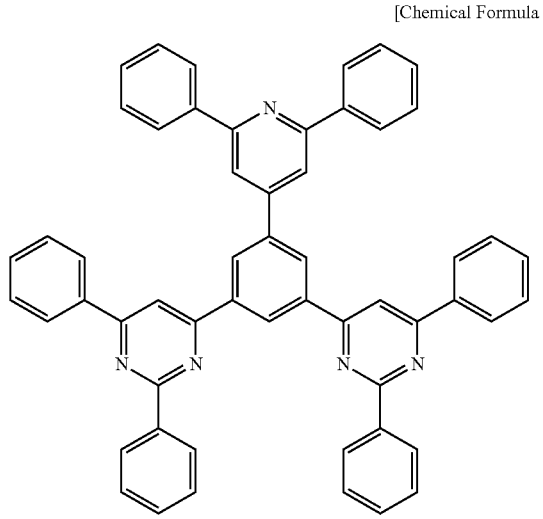

[Chemical Formula 4]

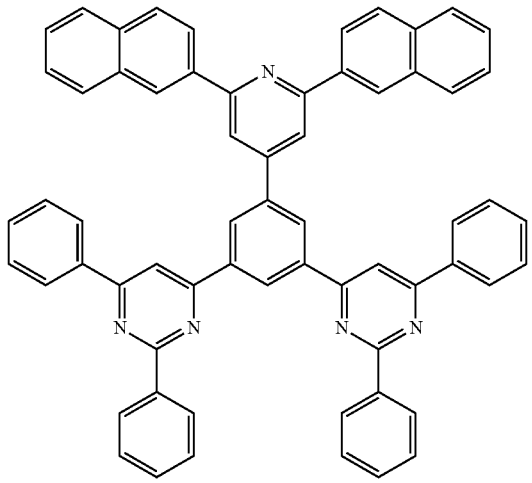

[Chemical Formula 5]

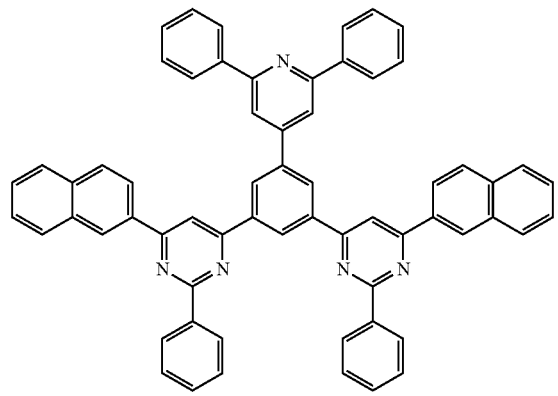

[Chemical Formula 6]

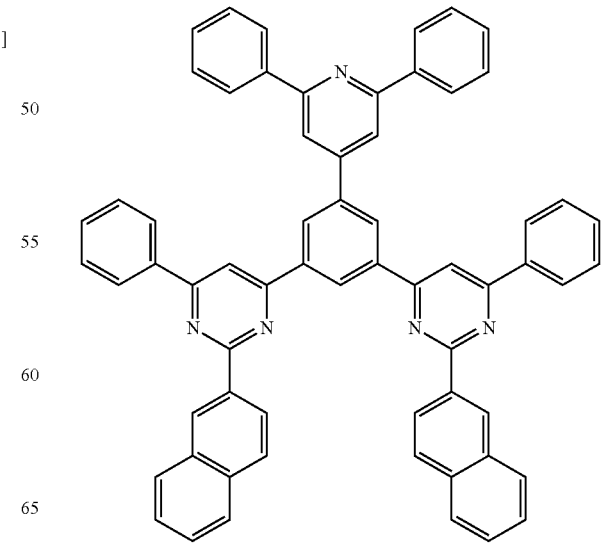

[Chemical Formula 7]
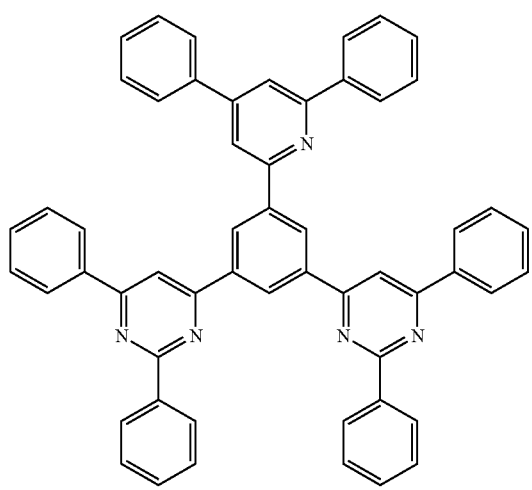
[Chemical Formula 8]
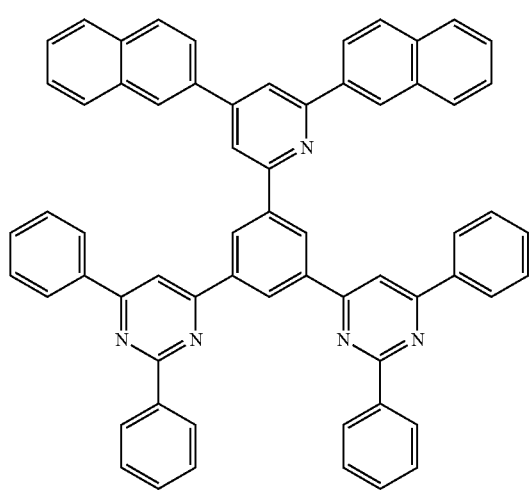
[Chemical Formula 9]
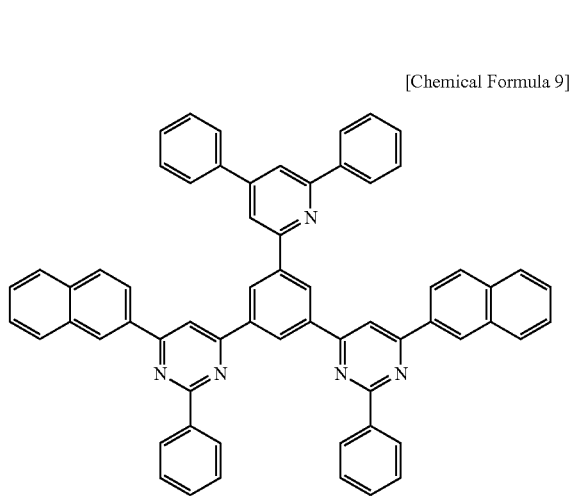
[Chemical Formula 10]
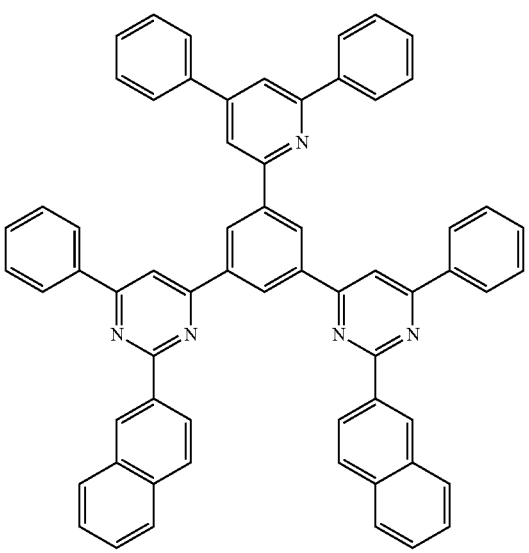
[Chemical Formula 11]
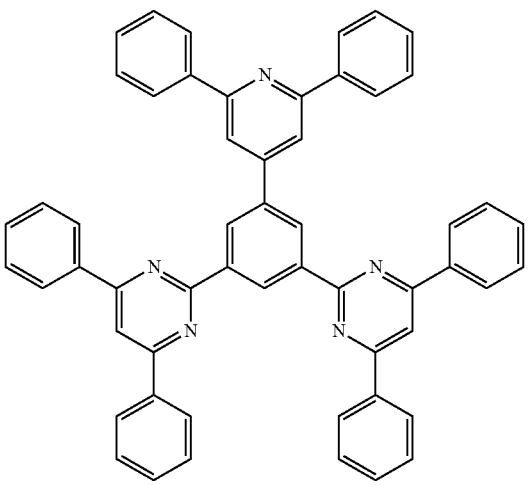
[Chemical Formula 12]
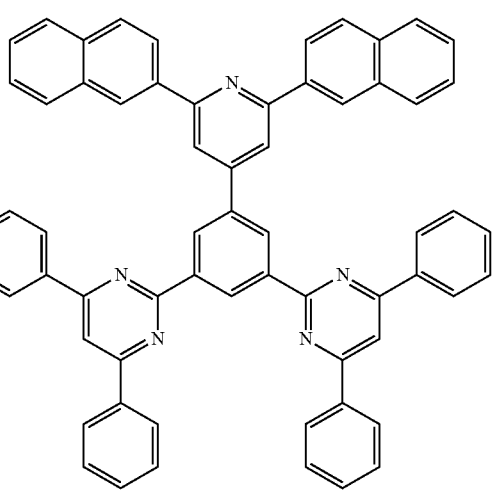

[Chemical Formula 13]
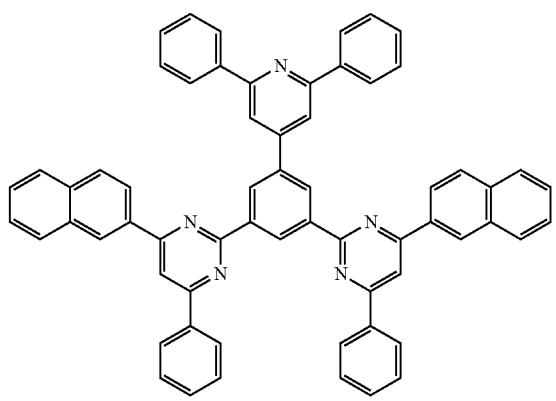
[Chemical Formula 14]
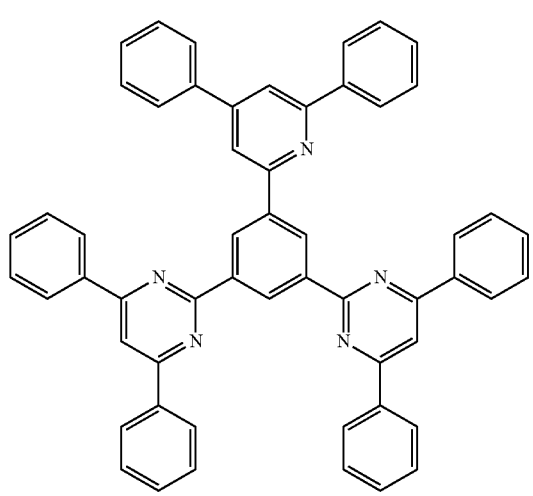
[Chemical Formula 15]
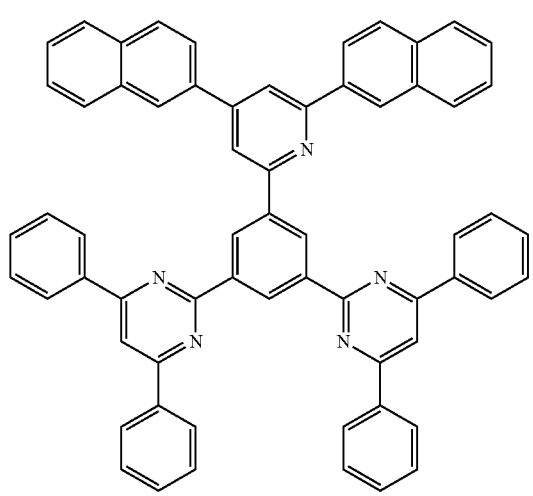
[Chemical Formula 16]
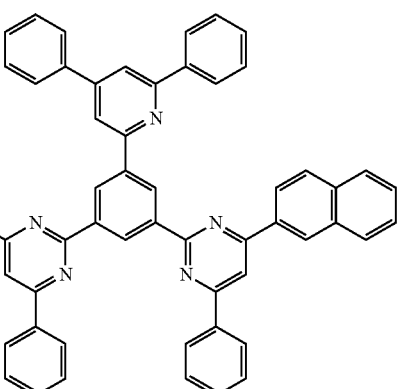
[Chemical Formula 17]
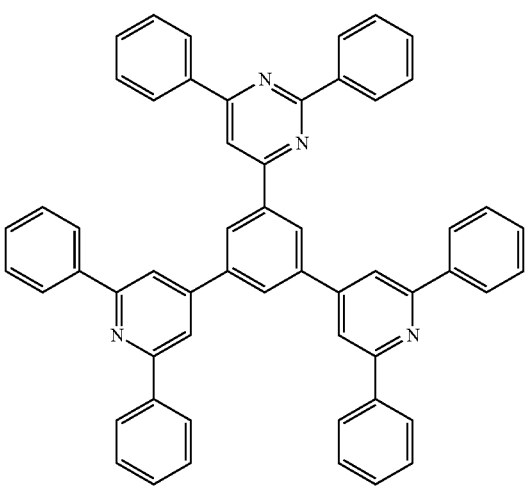
[Chemical Formula 18]
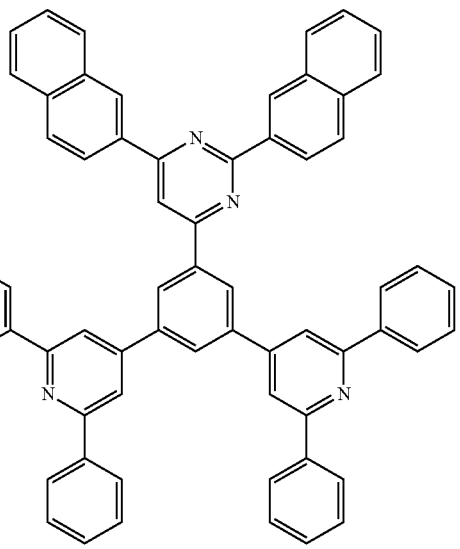

[Chemical Formula 19]
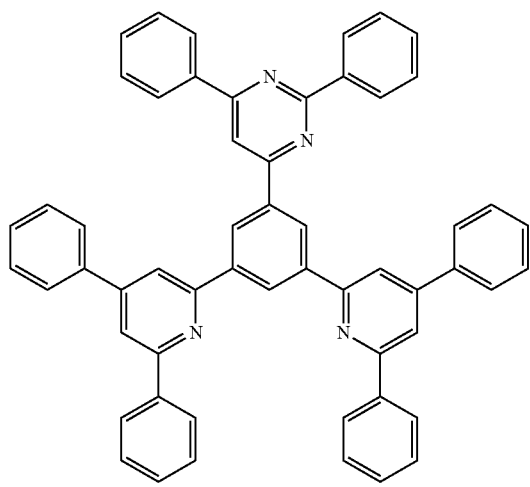
[Chemical Formula 20]
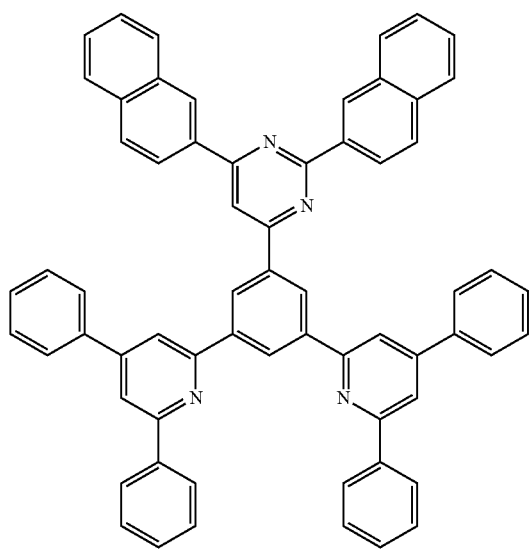
[Chemical Formula 21]
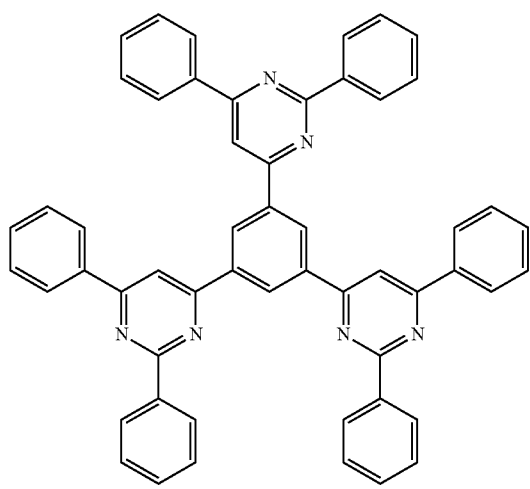
[Chemical Formula 22]
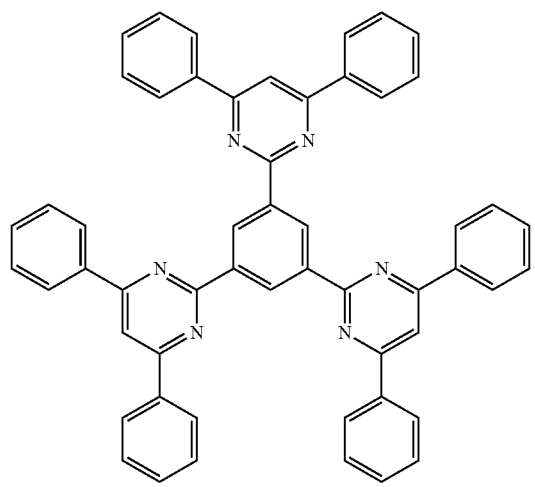
[Chemical Formula 23]
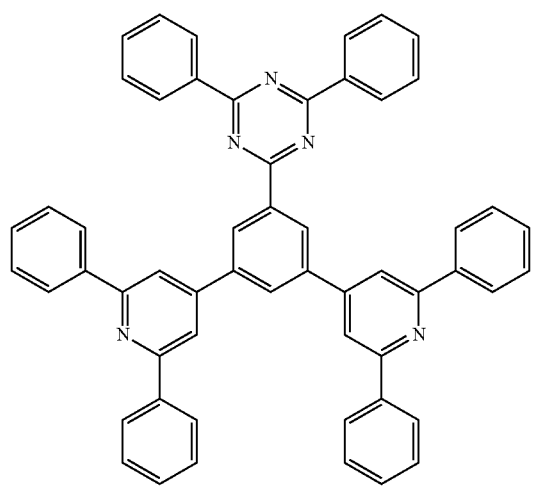
[Chemical Formula 24]
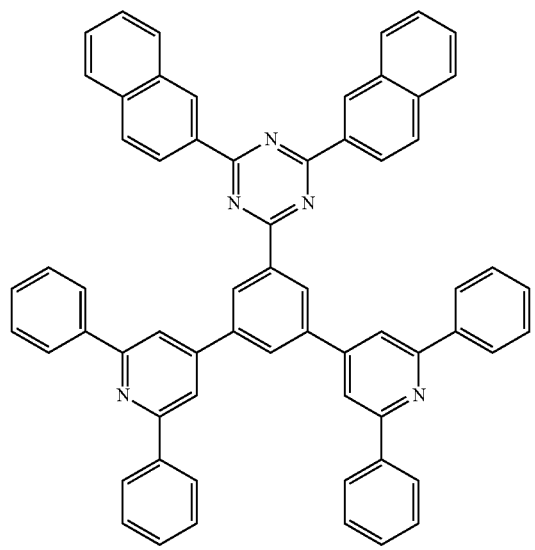

[Chemical Formula 25]
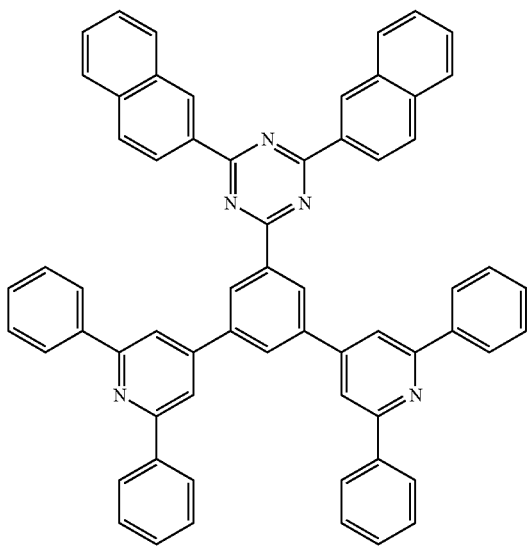
[Chemical Formula 26]
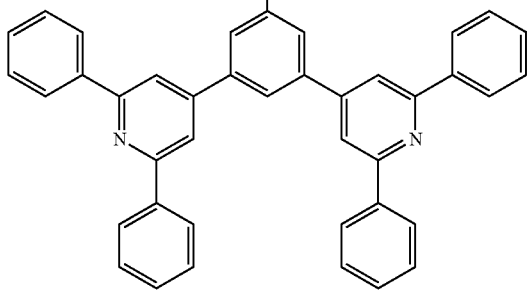
[Chemical Formula 27]
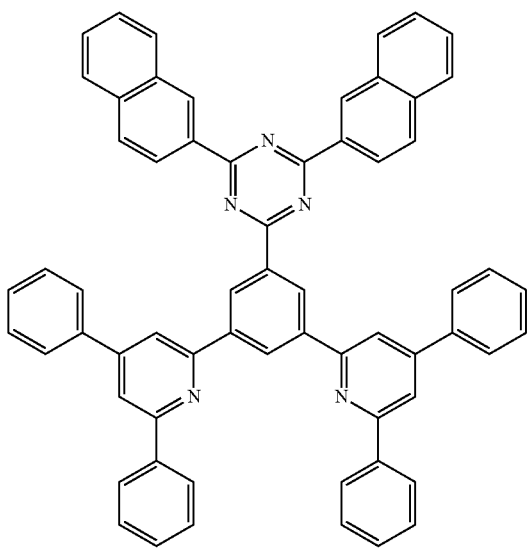
[Chemical Formula 28]
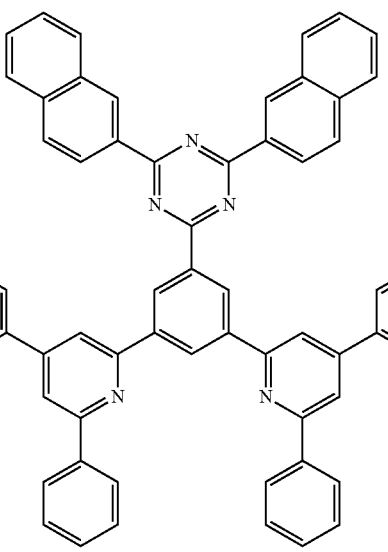
[Chemical Formula 29]
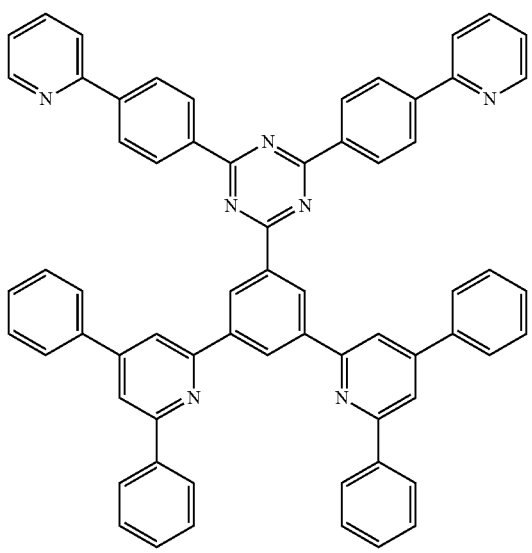
[Chemical Formula 30]
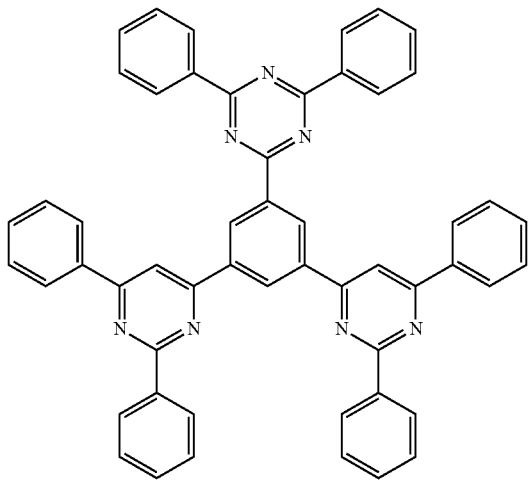

[Chemical Formula 31]

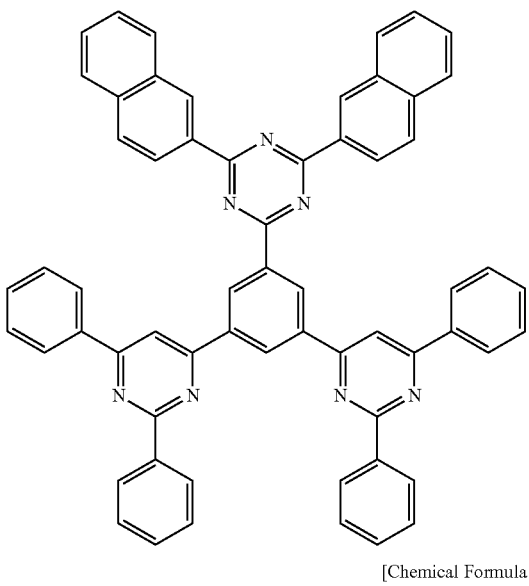

[Chemical Formula 32]

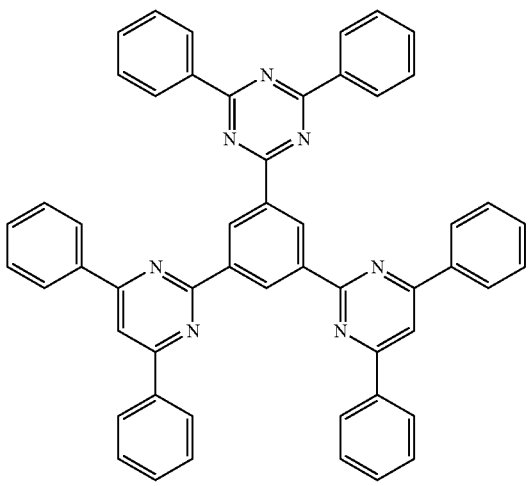

[Chemical Formula 33]

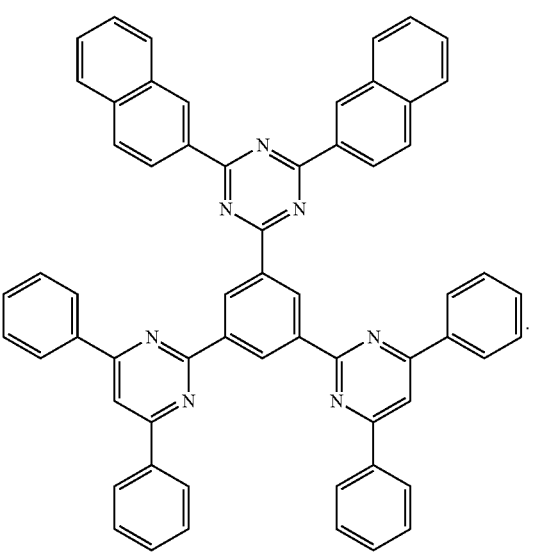

Embodiments are also directed to an organic photoelectric device, including an anode, a cathode, and an organic thin layer between the anode and the cathode, wherein the organic thin layer includes the compound for an organic photoelectric device according.

The organic thin layer may include one selected from the group of an emission layer, a hole transport layer (HTL), a hole injection layer (HIL), an electron transport layer (ETL), an electron injection layer (EIL), a hole blocking layer, and a combination thereof.

The compound for an organic photoelectric device may be included in an electron transport layer (ETL) or an electron injection layer (EIL).

The compound for an organic photoelectric device may be included in an emission layer.

The compound for an organic photoelectric device may be used as a phosphorescent or fluorescent host material in an emission layer.

The compound for an organic photoelectric device may be used as a fluorescent blue dopant material in an emission layer.

The organic photoelectric device may be selected from the group of an organic light emitting diode, an organic solar cell, an organic transistor, an organic photo conductor drum, and an organic memory device.

Embodiments are also directed to a display device including the organic photoelectric device.

Embodiments are also directed to an organic photoelectric device, including an anode, a cathode, and an organic thin layer between the anode and the cathode, wherein the organic thin layer includes the compound for an organic photoelectric device.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
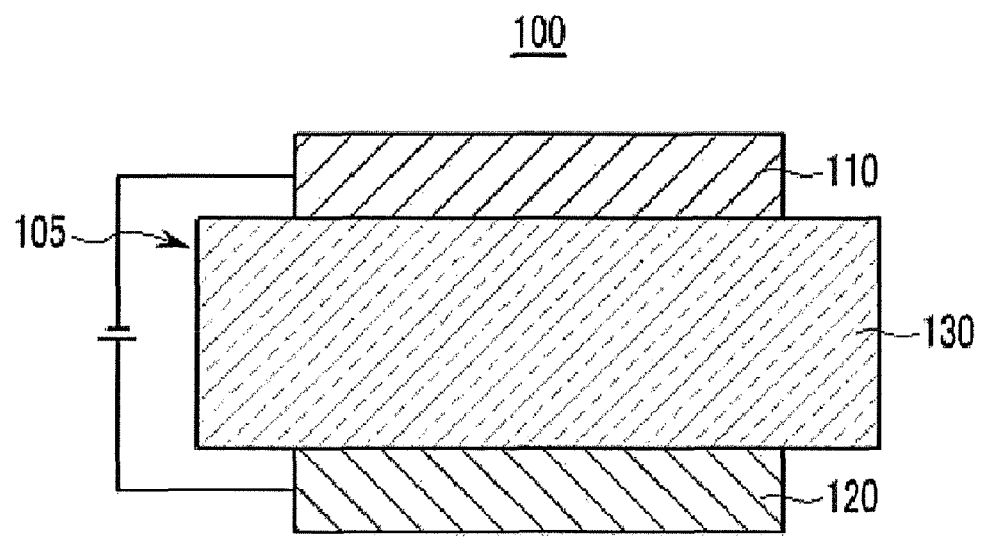
FIGS. 1 to 5 illustrate cross-sectional views of organic photoelectric devices according to embodiments.

Korean Patent Application No. 10-2009-0125506, filed on Dec. 16, 2009, in the Korean Intellectual Property Office, and entitled: "Compound for an Organic Photoelectric Device and Organic Photoelectric Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

Through the specification, the term "substituted" refers to one substituted with a C1 to C30 alkyl group, a C1 to C10 alkylsilyl group, a C3 to C30 cycloalkyl group, a C6 to C30 aryl group, a C1 to C10 alkoxy group, a fluoro group, a C1 to C10 trifluoroalkyl group such as a trifluoromethyl group, and the like, or a cyano group.

Through the specification, the term "hetero" refers to one including 1 to 3 heteroatoms selected from the group of N, O, S, and P and carbons in the rest thereof, in one ring.

Through the specification, the term "a combination thereof" refers to at least two substituents bound to each other by a linker or at least two substituents fused to each other.

Through the specification, when a definition is not otherwise provided, the term "alkyl" refers to an aliphatic hydrocarbon group. The alkyl may be a "saturated alkyl group" that does not include any alkene or alkyne. Alternatively, the alkyl may be an "unsaturated alkyl group" that includes at least one alkene or alkyne. The term "alkene" refers to a group in which at least two carbon atoms are bound in at least one carbon-carbon double bond, and the term "alkyne" refers to a group in which at least two carbon atoms are bound in at least one carbon-carbon triple bond. Regardless of being saturated or unsaturated, the alkyl may be branched, linear, or cyclic.

The alkyl group may have 1 to 20 carbon atoms. The alkyl group may be a medium-sized alkyl having 1 to 10 carbon atoms. The alkyl group may be a lower alkyl having 1 to 6 carbon atoms.

For example, a C1 to C4 alkyl may have 1 to 4 carbon atoms and may be selected from the group of methyl, ethyl, propyl, iso-propyl, n-butyl, iso-butyl, sec-butyl, and t-butyl.

Examples of an alkyl group may be selected from the group of methyl, ethyl, propyl, isopropyl, butyl, isobutyl, t-butyl, pentyl, hexyl, ethenyl, propenyl, butenyl, cyclopropyl, cyclobutyl, cyclopentyl, cyclohexyl, or the like, which may each be independently substituted.

The term "aryl" refers to an aryl group including a carbocyclic aryl (e.g., phenyl) having at least one ring having a covalent pi electron system. The term also refers to monocyclic or fused polycyclic (i.e., rings sharing adjacent pairs of carbon atoms) groups. In addition, this term also refers to a Spiro compound having a contact point of one carbon.

The term "heteroaryl" refers to a heterocyclic aryl group including a carbocyclic aryl (e.g., pyridine) having at least one ring having a covalent pi electron system. The term also refers to monocyclic or fusion ring polycyclic (i.e., groups sharing adjacent pairs of carbon atoms) groups. In addition, the term also refers to a spiro compound having a contact point of one carbon.

According to an embodiment, the compound for an organic photoelectric device may have a structure that includes three heteroaryl groups bound to a benzene core. The three heteroaryl groups may be bound at the positions of 1, 3, and 5 of the core benzene.

In addition, the compound for an organic photoelectric device may have various energy bands and may be synthesized by introducing various substituents to the core benzene and/or the three heteroaryl groups. The energy bands of the compound for an organic photoelectric device according to an embodiment may be useful for at least one of an emission layer, an electron injection layer (EIL), and a transport layer.

The energy level of the compound for an organic photoelectric device according to an embodiment may result in improved electrochemical and thermal stability. Thus, an organic photoelectric device including the compound for an organic photoelectric device may have improved electron transport capability (e.g., to improve the efficiency and the driving voltage), and may have improved life-span characteristics when driving the organic photoelectric device.

According to an embodiment, the compound for an organic photoelectric device may be represented by the following Chemical Formula 1 or 2.

[Chemical Formula 1]

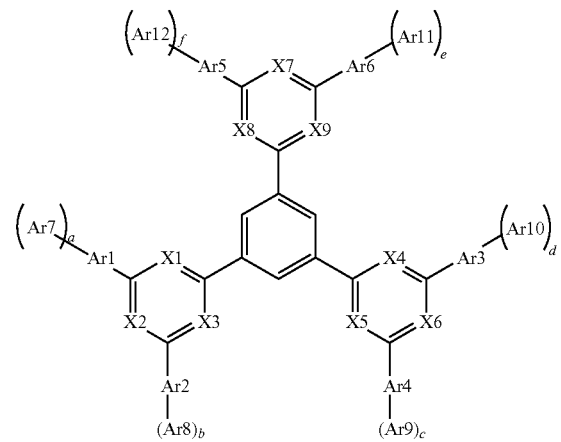

[Chemical Formula 2]

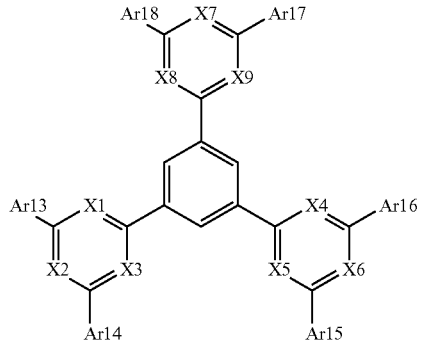

In Chemical Formulae 1 and 2, X1 to X9 may be independently a heteroatom or CR, wherein R is selected from the group of hydrogen, a C1 to C30 alkyl group, and a C6 to C30 aryl group. At least two of X1 to X3 may be a heteroatom, at least one of X4 to X6 may be a heteroatom, and at least one of X7 to X9 may be a heteroatom.

There may be only three heteroaryl groups bonded to the benzene core. One of the heteroaryl groups may include at least two heteroatoms.

According to embodiments, the number of heteroatoms included in each heteroaryl group is changed to change characteristics of the compound. For example, at least two of X4 to X6 may be a heteroatom (i.e., in addition to the at least two of X1 to X3). Thereby, two heteroaryl groups among the three heteroaryl groups may include at least two heteroatoms.

Examples the compound represented by Chemical Formulae 1 or 2 may be as follows:

a compound where X2, X3, X5, X6, and X7 are heteroatoms, and a compound where X2, X3, X5, X6, and X9 are heteroatoms;

a compound where X2, X3, X5, X6, X7, and X9 are heteroatoms, a compound where X2, X3, X5, X6, X8, and X9 are heteroatoms, a compound where X1, X3, X4, X5, X8, and X9 are heteroatoms, and a compound where X1, X3, X4, X5, X7, and X9 are heteroatoms;

a compound where X2, X6, X7, and X9 are heteroatoms, and a compound where X3, X5, X7, and X9 are heteroatoms;

a compound where X2, X6, X7, X8, and X9 are heteroatoms, and a compound where X3, X5, X7, X8, and X9 are heteroatoms; and a compound where X2, X3, X5, X6, X7, X8, and X9 are heteroatoms, and a compound where X1, X3, X4, X5, X7, X8, and X9 are heteroatoms.

In each of the example compounds described above, the remainder of X1 to X9 may be CR.

The heteroatom may be a suitable heteroatom, and it is preferable that the heteroatom is N.

In Chemical Formula 1, Ar1 to Ar6 may be independently selected from the group of a substituted or unsubstituted C6 to C30 arylene group, a substituted or unsubstituted C3 to C30 heteroarylene group, a substituted or unsubstituted C6 to C30 arylaminylene group, a substituted or unsubstituted carbazolylene group, and a substituted or unsubstituted fluorenylene group.

According to embodiments, the π conjugation lengths of Ar1 to Ar6 is changed to change the light emission characteristics in the visible region. Thus, when the π conjugation lengths are within a suitable range, the compound may be usefully applied to an emission layer of an organic photoelectric device.

Examples of Ar1 to Ar6 may be a phenylene group, a biphenylene group, a terphenylene group, a stilbenzylene group, a naphthylene group, an anthracenylene group, a phenanthrenyl group, a pyrenyl group, a perylenyl group, and the like.

In Chemical Formula 1, Ar7 to Ar12 may be independently a substituted or unsubstituted C6 to C30 aryl group, or a substituted or unsubstituted C3 to C30 heteroaryl group, and a, b, c, d, e and f may be independently an integer of 1 to 2.

The compound may have an excellent thermal stability and resistance to oxidation, so the life-span characteristics of organic photoelectric device may be improved.

According to embodiments, the kind of substituent bonded to the benzene core and/or the three heteroaryl groups is changed to change electron transport capacity. In addition, the compound may be provided with a bulk structure, so the crystallinity may be decreased. When the crystallinity of compound is decreased, the life-span of device may be prolonged.

Examples of Ar7 to Ar12 may be a phenyl group, a biphenyl group, a terphenyl group, a stilbenzyl group, a naphthyl group, an anthracenyl group, a phenanthrenyl group, a pyrenyl group, or a perylenyl group.

Other examples of Ar7 to Ar12 may be a thiophenyl group, a furanyl group, a pyrrolyl group, an imidazolyl group, a triazolyl group, an oxazolyl group, an oxadiazolyl group, a triazolyl group, a pyridinyl group, a pyradazinyl group, a quinolinyl group, an isoquinolinyl group, an acridinyl group, an imidazopyridinyl group, an imidazopyrimidinyl group, a benzoquinolinyl group, or a phenanthrolinyl group.

In Chemical Formula 2, Ar13 to Ar18 may be independently selected from the group of a substituted or unsubstituted C6 to C30 aryl group, a substituted or unsubstituted C3 to C30 heteroaryl group, a substituted or unsubstituted C6 to C30 arylamine group, a substituted or unsubstituted carbazolyl group, and a substituted or unsubstituted fluorenyl group.

The compound may have excellent thermal stability and resistance to oxidation, so the life-span characteristics of organic photoelectric device may be improved.

According to embodiments, the kind of substituent bonded to the benzene core and/or the three heteroaryl groups is changed to change electron transport capacity. In addition, the compound may be provided with a bulk structure, so the crystallinity may be decreased. When the crystallinity of compound is decreased, the life-span of device may be prolonged.

Examples of Ar13 to Ar18 may be a phenyl group, a biphenyl group, a terphenyl group, a stilbenzyl group, a naphthyl group, an anthracenyl group, a phenanthrenyl group, a pyrenyl group, a perylenyl group, and the like.

Other examples of Ar13 to Ar18 may be a thiophenyl group, a furanyl group, a pyrrolyl group, an imidazolyl group, a thiazolyl group, an oxazolyl group, an oxadiazolyl group, a triazolyl group, a pyridinyl group, a pyradazinyl group, a quinolinyl group, an isoquinolinyl group, an acridinyl group, an imidazopyridinyl group, an imidazopyrimidinyl group, a benzoquinolinyl group, a phenanthrolinyl group, and the like.

The compound for an organic photoelectric device may be represented by the following Chemical Formulae 3 to 33.

[Chemical Formula 3]

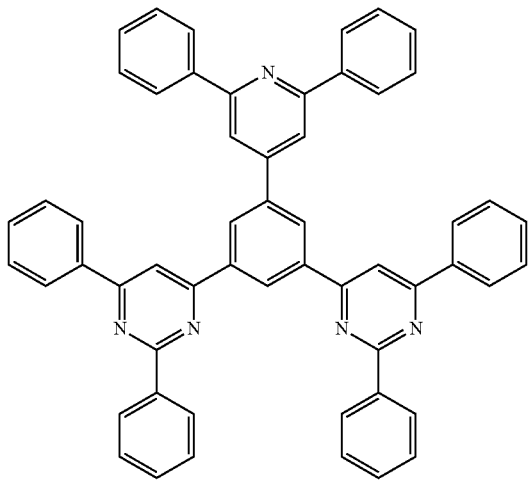

[Chemical Formula 4]

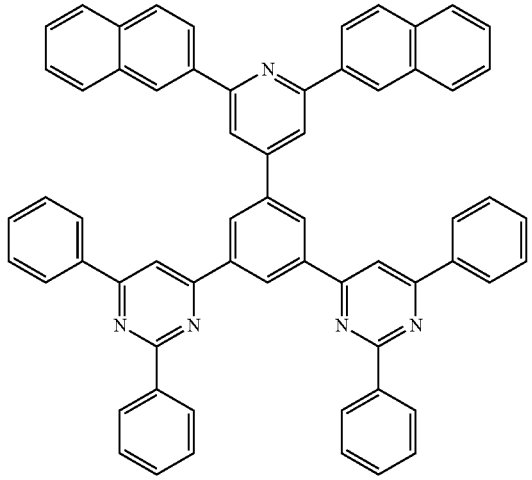

[Chemical Formula 5]
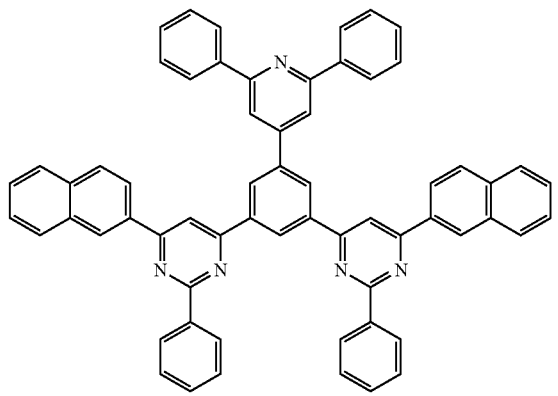
[Chemical Formula 6]
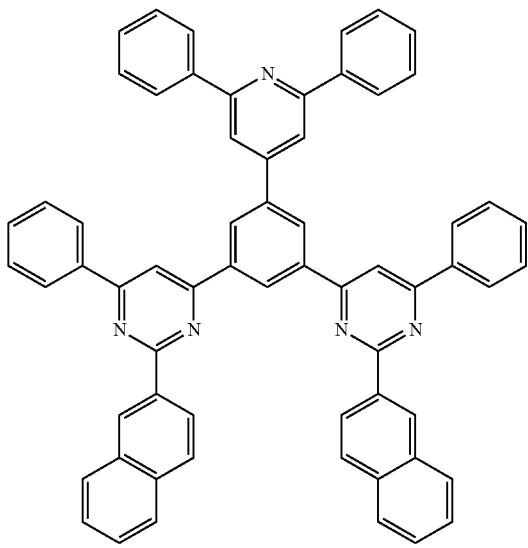
[Chemical Formula 7]
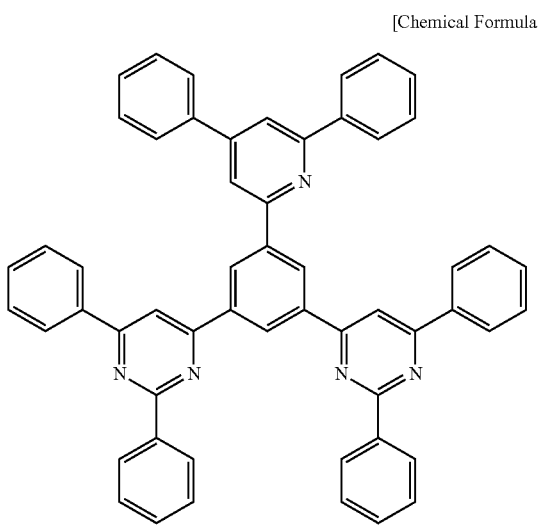
[Chemical Formula 8]
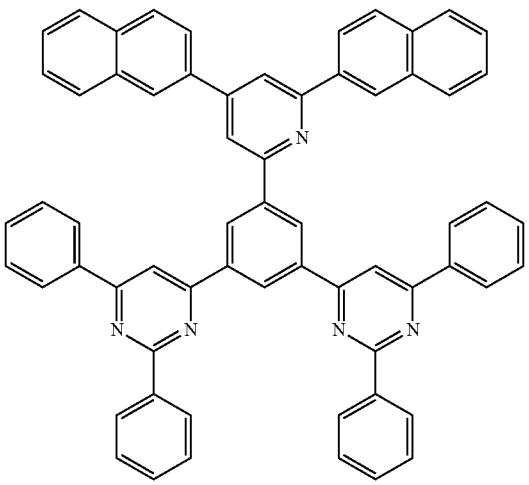
[Chemical Formula 9]
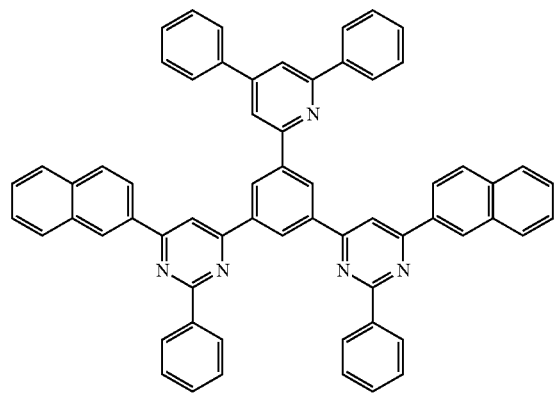
[Chemical Formula 10]
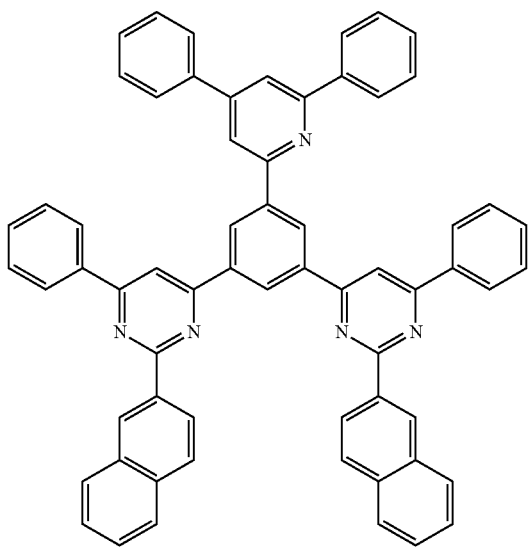

[Chemical Formula 11]
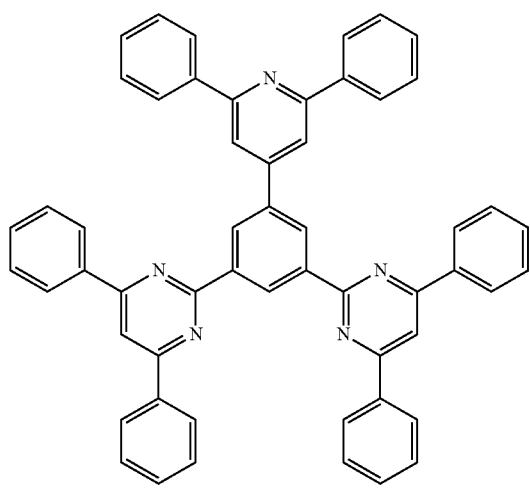
[Chemical Formula 12]
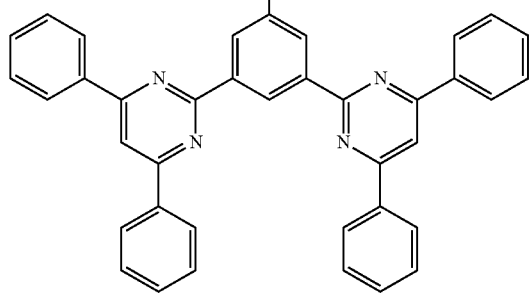
[Chemical Formula 13]
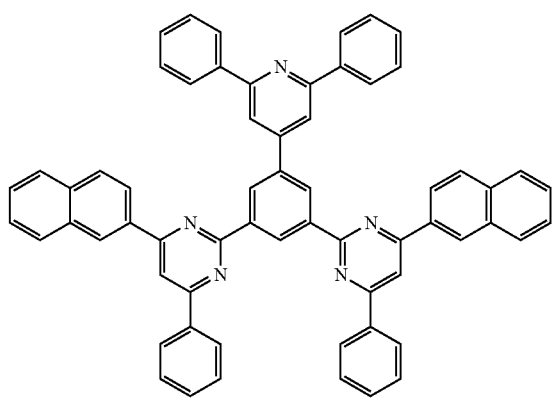
[Chemical Formula 14]
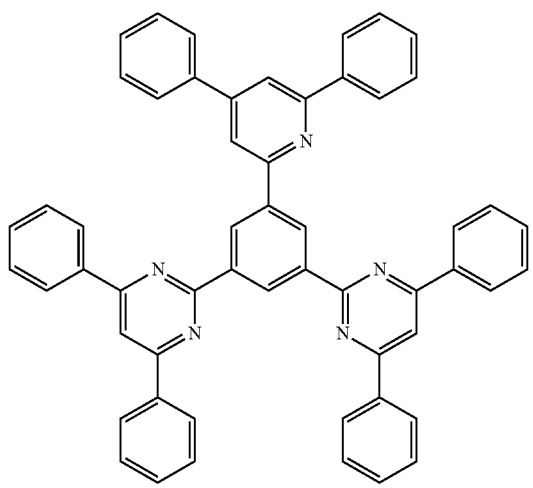
[Chemical Formula 15]
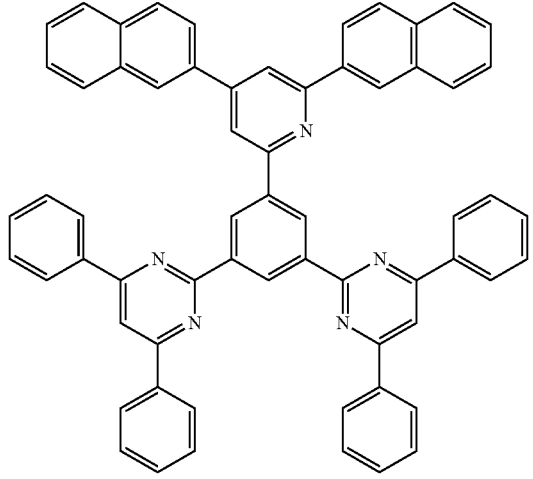
[Chemical Formula 16]
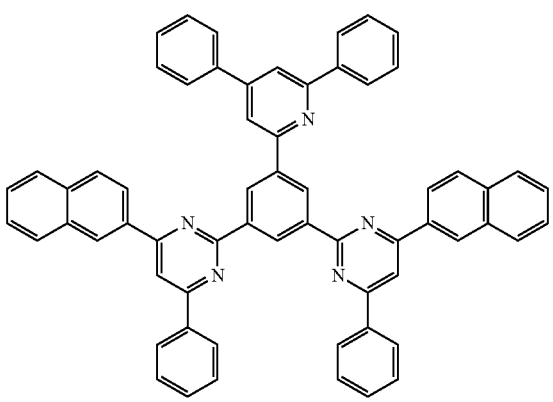

[Chemical Formula 17]
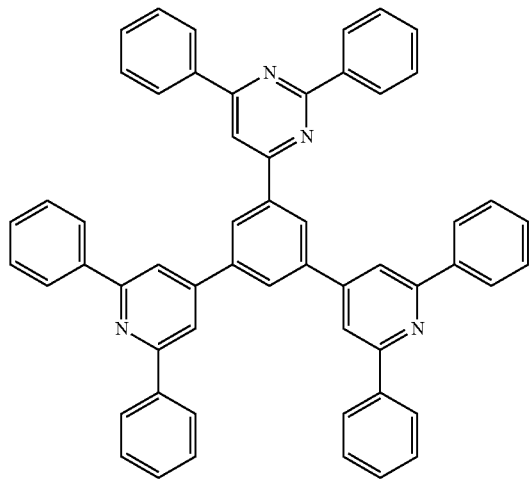
[Chemical Formula 18]
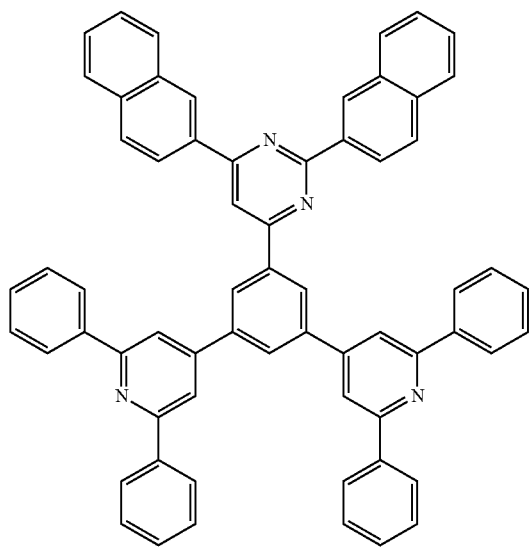
[Chemical Formula 19]
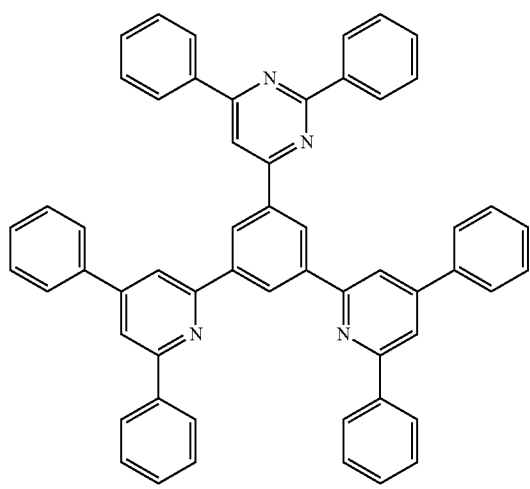
[Chemical Formula 20]
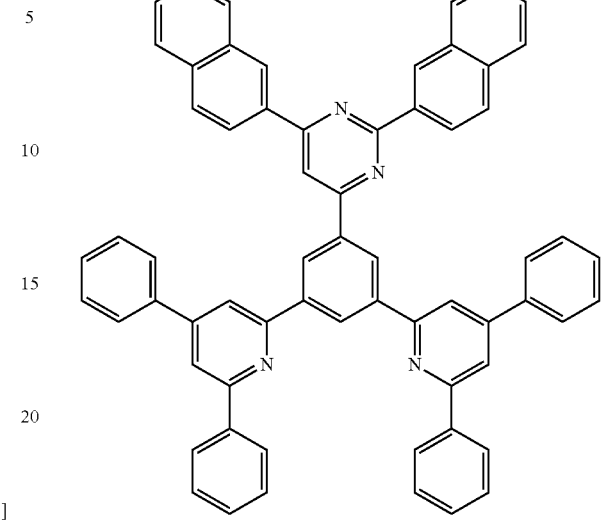
[Chemical Formula 21]
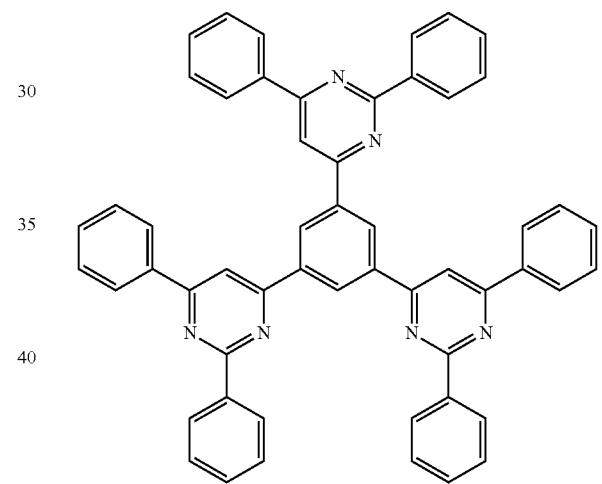
[Chemical Formula 22]
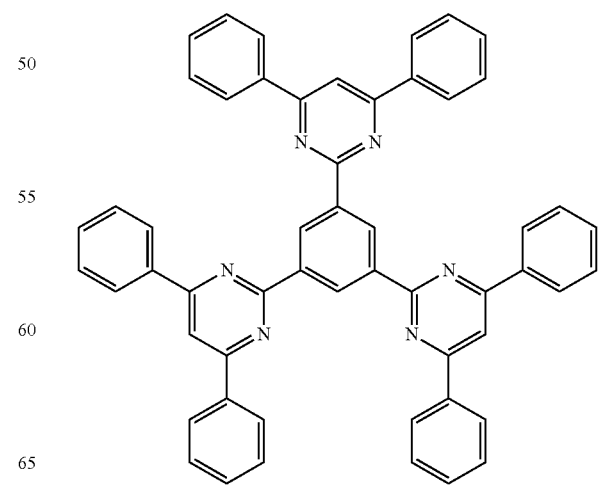

[Chemical Formula 23]
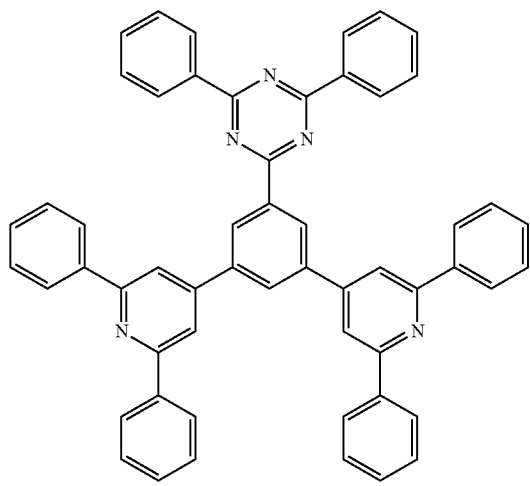
[Chemical Formula 24]
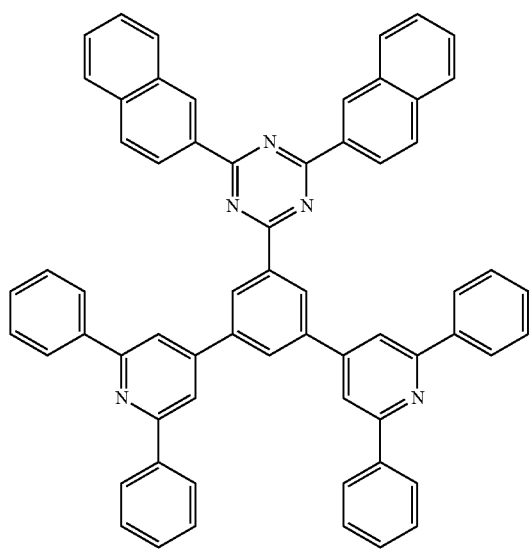
[Chemical Formula 25]
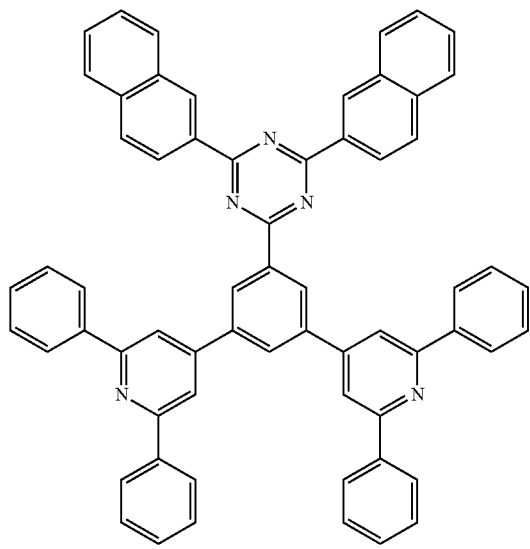
[Chemical Formula 26]
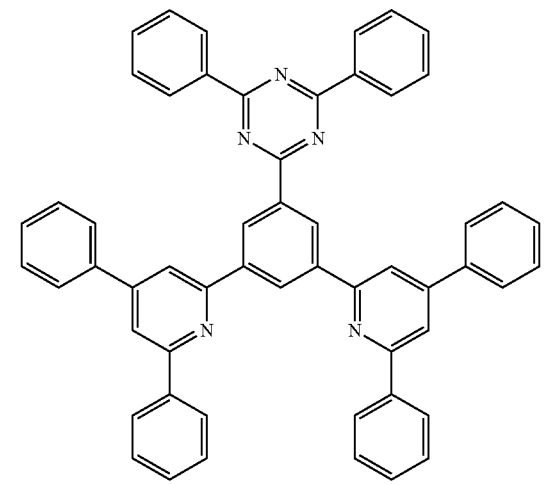
[Chemical Formula 27]
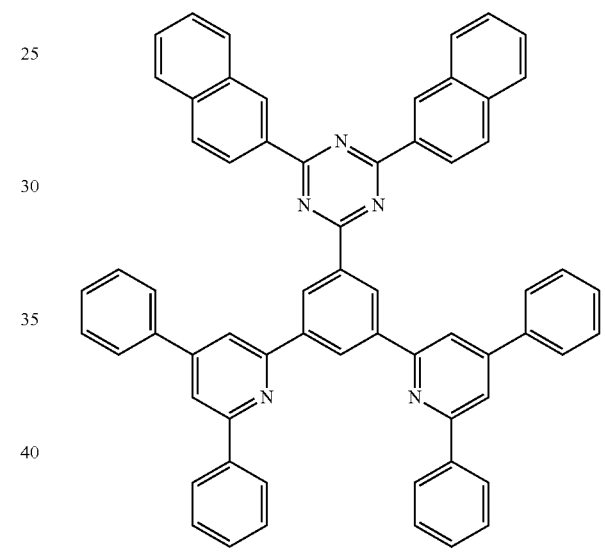
[Chemical Formula 28]
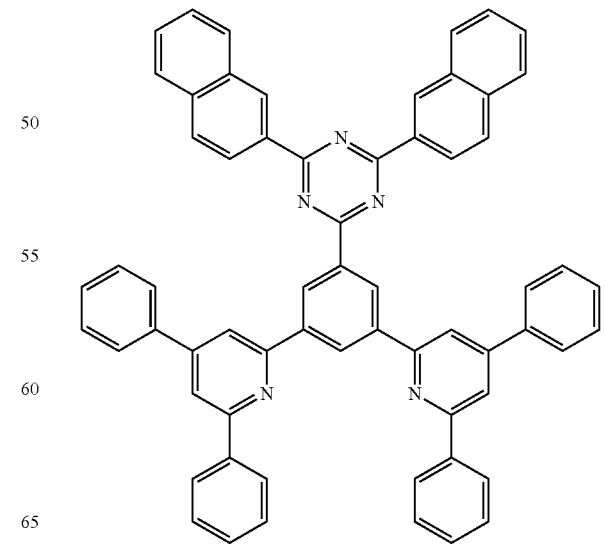

[Chemical Formula 29]
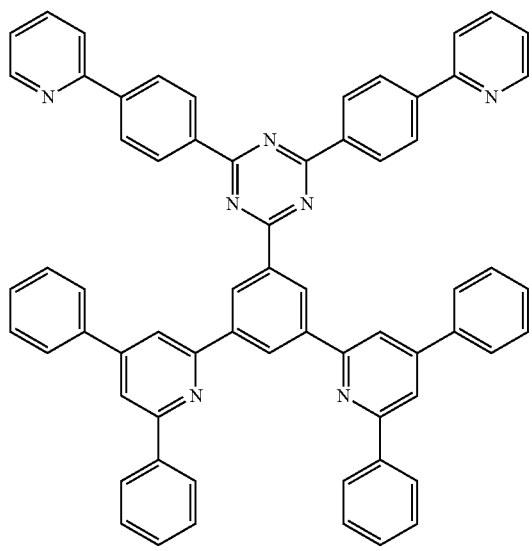

[Chemical Formula 30]
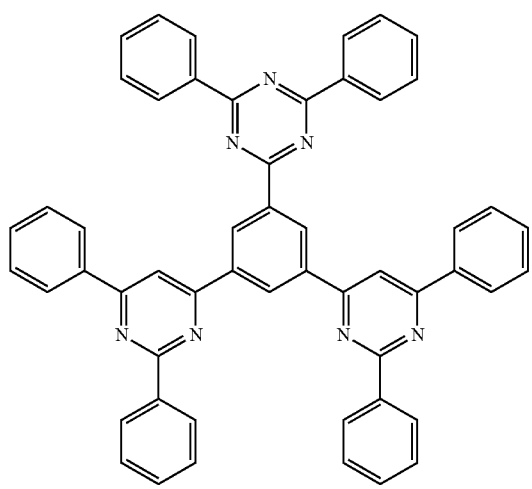

[Chemical Formula 31]
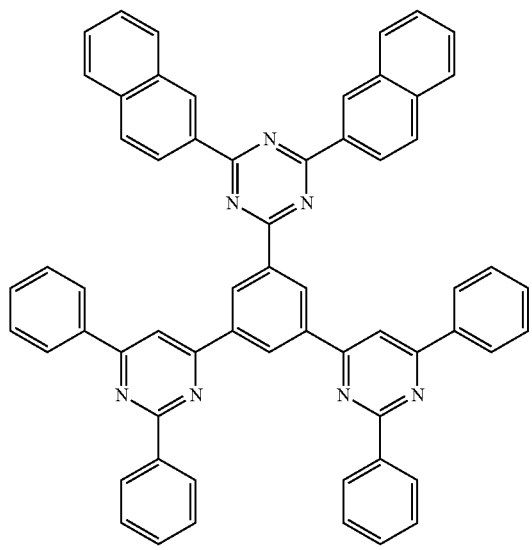

[Chemical Formula 32]
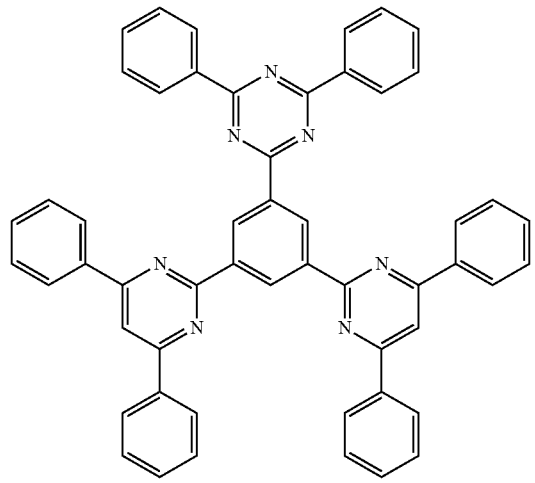

[Chemical Formula 33]
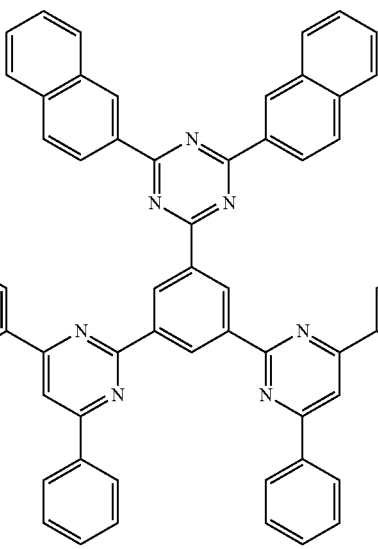

The compound for an organic photoelectric device according to an embodiment may have a glass transition temperature of higher than or equal to about 110° C. and/or a thermal decomposition temperature of higher than or equal to about 400° C., so that thermal stability may be improved. Thereby, an organic photoelectric device having a high efficiency may be realized.

The compound for an organic photoelectric device may play a role in at least one of emitting light and injecting and/or transporting electrons, and it may act as a light emitting host together with a suitable dopant. The compound for an organic photoelectric device may be applied as at least one of a phosphorescent or fluorescent host material, a blue light emitting dopant material, and an electron transport material.

The compound for an organic photoelectric device according to an embodiment may be used for an organic thin layer, and may improve the life-span characteristic, efficiency characteristic, electrochemical stability, and thermal stability of an organic photoelectric device, and may decrease the driving voltage.

According to an embodiment, an organic photoelectric device may be provided that includes the compound for an organic photoelectric device. The organic photoelectric device may include, e.g., an organic light emitting diode, an organic solar cell, an organic transistor, an organic photosensitive drum, an organic memory device, or the like. For example, the compound for an organic photoelectric device may be included in an electrode or an electrode buffer layer in an organic solar cell to improve the quantum efficiency, and it may be used as an electrode material (e.g., for a gate electrode, a source-drain electrode, or the like) in an organic transistor.

Hereinafter, a more detailed description of the organic photoelectric device according to an embodiment will be provided.

According to an embodiment, the organic photoelectric device may include an anode, a cathode, and an organic thin layer interposed between the anode and the cathode, wherein the organic thin layer may include the compound for an organic photoelectric device.

The organic thin layer that may include the compound for an organic photoelectric device and may include a layer selected from the group of an emission layer, a hole transport layer (HTL), a hole injection layer (HIL), an electron transport layer (ETL), an electron injection layer (EIL), a hole blocking film, and a combination thereof. Particularly, the electron transport layer (ETL) or the electron injection layer (EIL) may include the compound for an organic photoelectric device. In addition, when the compound for an organic photoelectric device is included in an emission layer, the compound for an organic photoelectric device may be included as a phosphorescent or fluorescent host. In an embodiment, the compound may be included as a fluorescent blue dopant material.

FIGS. 1 to 5 are cross-sectional views illustrating an organic photoelectric device including the compound for an organic photoelectric device.

Referring to FIGS. 1 to 5, respective organic photoelectric devices 100, 200, 300, 400, and 500 are illustrated. According to an embodiment, each of these organic photoelectric devices 100, 200, 300, 400, and 500 may include an organic thin layer 105 interposed between an anode 120 and a cathode 110.

The anode 120 may include a suitable anode material, and may include an anode material having a large work function (e.g., to help hole injection into an organic thin layer). The anode material may include at least one of a metal (e.g., nickel, platinum, vanadium, chromium, copper, zinc, gold or alloys thereof), a metal oxide (e.g., zinc oxide, indium oxide, indium tin oxide (ITO), and/or indium zinc oxide (IZO)), a combined metal and oxide (e.g., ZnO:Al or SnO2:Sb), and a conductive polymer (e.g., poly(3-methylthiophene), poly[3, 4-(ethylene-1,2-dioxy)thiophene] (PEDT), polypyrrole, and/or polyaniline). It is preferable to include a transparent electrode (e.g., including indium tin oxide (ITO)) as an anode.

The cathode 110 may include a suitable cathode material, and may be a cathode material having a small work function (e.g., to help electron injection into an organic thin layer). The cathode material may include at least one of a metal (e.g., magnesium, calcium, sodium, potassium, titanium, indium, yttrium, lithium, gadolinium, aluminum, silver, tin, lead, or alloys thereof), and a multi-layered material (e.g., LiF/Al, Liq/Al, LiO$_2$/Al, LiF/Ca, LiF/Al, and/or BaF$_2$/Ca). It is preferable to include a metal electrode including aluminum as a cathode.

Referring to FIG. 1, the organic photoelectric device 100 may include an organic thin layer 105 including only an emission layer 130.

Figure 2:
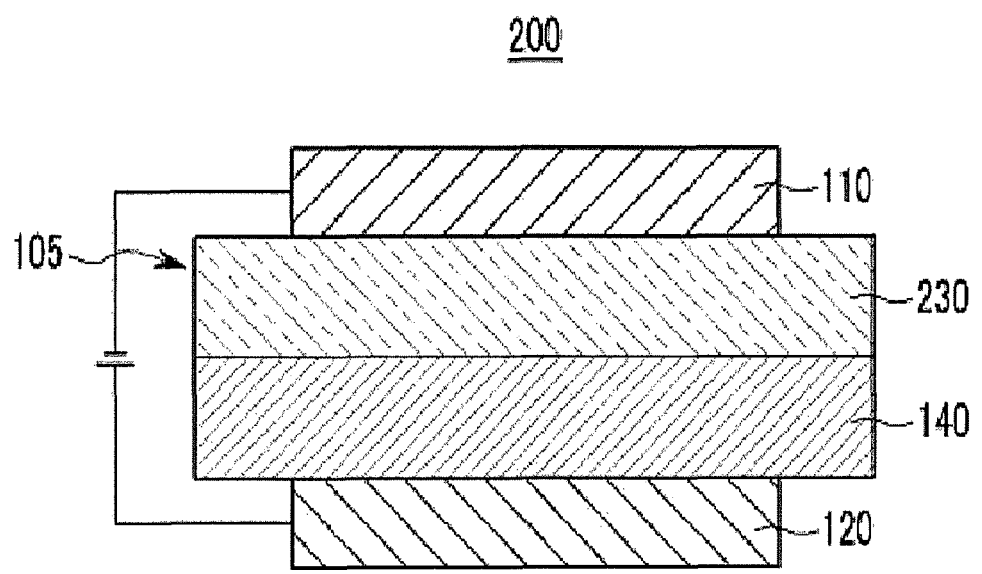

Referring to FIG. 2, a double-layered organic photoelectric device 200 may include an organic thin layer 105 including an emission layer 230 (which may also function as an electron transport layer (ETL)), and a hole transport layer (HTL) 140. As shown in FIG. 2, the organic thin layer 105 may include a double layer of the emission layer 230 and hole transport layer (HTL) 140.

Figure 3:
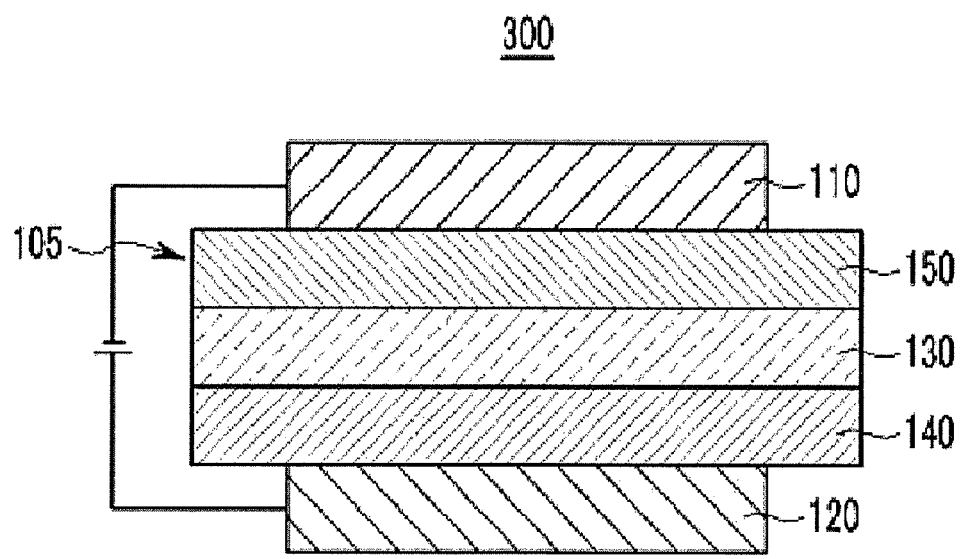

Referring to FIG. 3, a three-layered organic photoelectric device 300 may include an organic thin layer 105 including an electron transport layer (ETL) 150, an emission layer 130, and a hole transport layer (HTL) 140. The emission layer 130 may be independently installed, and layers having an excellent electron transporting property and/or an excellent hole transporting property may be separately stacked.

Figure 4:
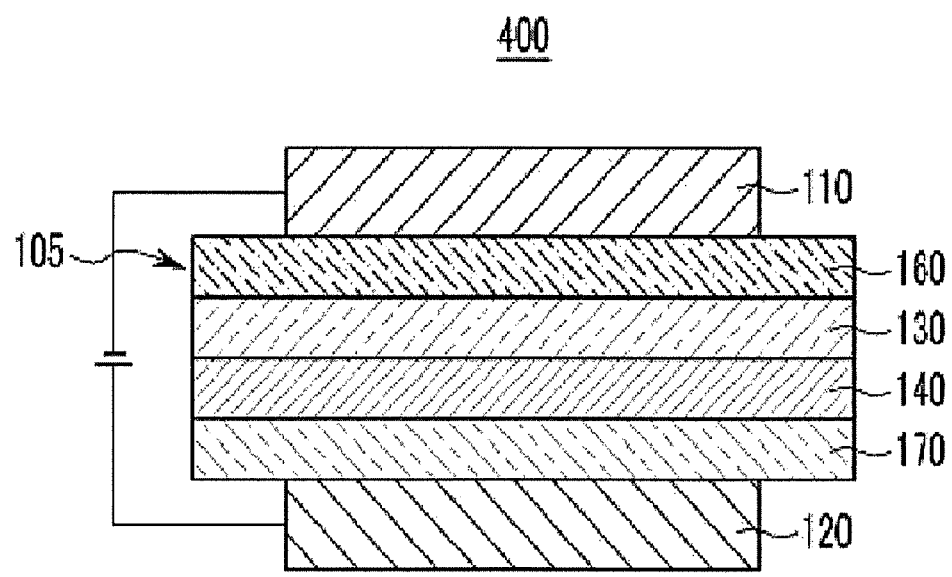

As shown in FIG. 4, a four-layered organic photoelectric device 400 may include an organic thin layer 105 including an electron injection layer (EIL) 160, an emission layer 130, a hole transport layer (HTL) 140, and a hole injection layer (HIL) 170, and may be bound with the cathode 110 of ITO.

Figure 5:
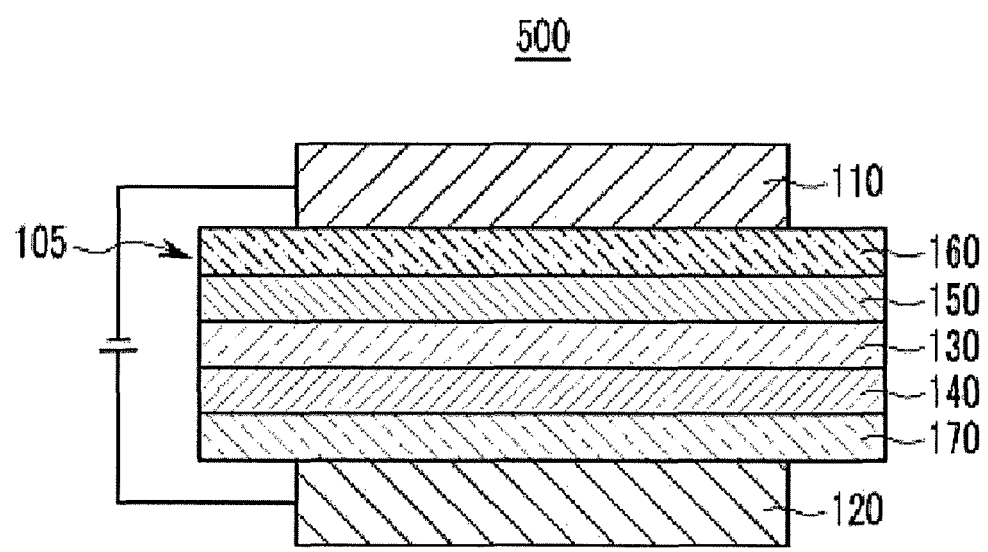

As shown in FIG. 5, a five layered organic photoelectric device 500 may include an organic thin layer 105 including an electron transport layer (ETL) 150, an emission layer 130, a hole transport layer (HTL) 140, and a hole injection layer (HIL) 170, and may further include an electron injection layer (EIL) 160 (e.g., to achieve a low voltage).

In FIGS. 1 to 5, the organic thin layer 105 may include at least one selected from the group of an electron transport layer (ETL) 150, an electron injection layer (EIL) 160, emission layers 130 and/or 230, a hole transport layer (HTL) 140, a hole injection layer (HIL) 170, and combinations thereof. At least one of these layers may include the compound for an organic photoelectric device. The compound for the organic photoelectric device may be used for an electron transport layer (ETL) 150 or an electron injection layer (EIL) 160. When it is used for the electron transport layer (ETL), it may be possible to provide an organic photoelectric device having a more simplified structure because it may not require an additional hole blocking layer (not shown).

Furthermore, when the compound for an organic photoelectric device is included in the emission layers 130 and/or 230, the material for the organic photoelectric device may be included as a phosphorescent or fluorescent host or a fluorescent blue dopant.

The organic photoelectric device may be fabricated by: forming an anode on a substrate, forming an organic thin layer (e.g., by a dry coating method such as evaporation, sputtering, plasma plating, and ion plating, or a wet coating method such as spin coating, dipping, and flow coating), and providing a cathode thereon.

In an embodiment, a display device may include the organic photoelectric device as discussed above.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Preparation of Compound for an Organic Photoelectric Device

Example 1

Synthesis of the Compound Represented by Chemical Formula 3

The compound represented by Chemical Formula 3 was synthesized in accordance with the following Reaction Scheme 1.

[Reaction Scheme 1]

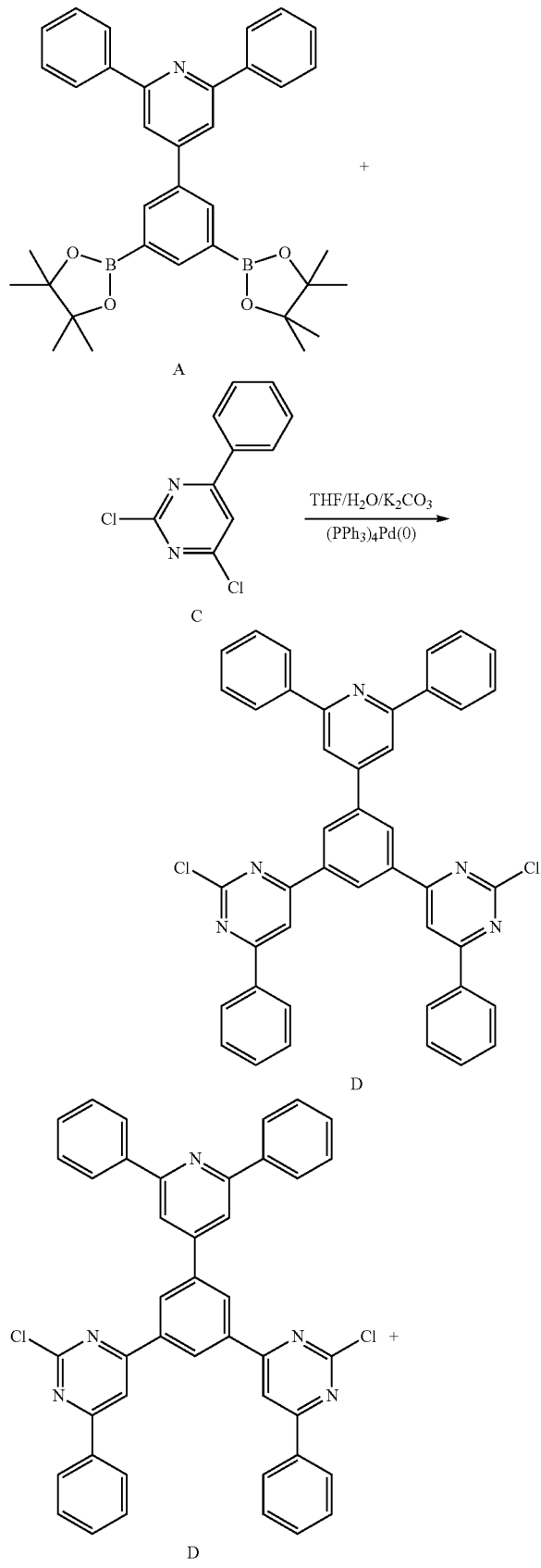

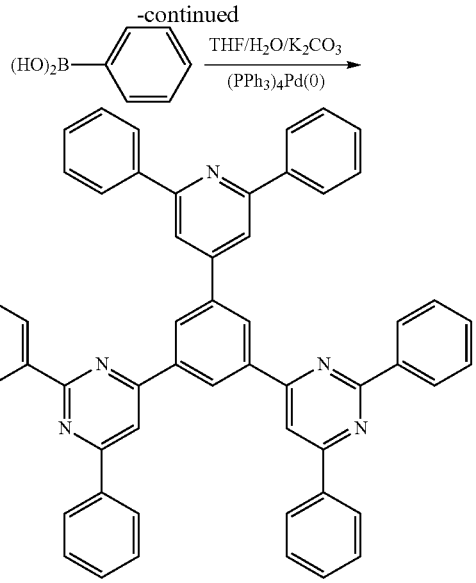

First Step: Synthesis of Intermediate Product (D)

In a 500 mL round-bottomed flask having a thermometer, a reflux condenser, and an agitator, 8.0 g (14.3 mmol) of compound (A), 8.04 g (35.7 mmol) of compound (C), and 0.8 g (0.69 mmol) of tetrakis(triphenylphosphine)palladium were mixed with 300 mL of tetrahydrofuran under a nitrogen atmosphere, and then the mixed solution was mixed with 100 mL of 2 M potassium carbonate ($K_2CO_3$) and agitated at 70° C. for 12 hours.

By cooling to room temperature, the reaction was completed, and then the produced solid was filtered and washed with methanol several times. The final residue was purified by silica-gel chromatography using a chloroform solvent to provide an intermediate product (D) in 6.6 g (yield: 67.4%).

Second Step: Synthesis of Compound Represented by Chemical Formula 3

In a 500 mL round-bottomed flask having a thermometer, a reflux condenser, and an agitator, 6.6 g (9.64 mmol) of the intermediate product (D) synthesized in the first step, 4.42 g (24.1 mmol) of phenylboronic acid, and 0.7 g (0.6 mmol) of tetrakis(triphenylphosphine)palladium were mixed with 300 mL of tetrahydrofuran, and then the mixed solution was mixed with 100 mL of 2 M potassium carbonate ($K_2CO_3$) and agitated at 80° C. for 12 hours to provide a white solid.

By cooling to room temperature, the reaction was completed, and then the potassium carbonate solution was removed to filter a white solid. The filtered white solid was washed with tetrahydrofuran three times, washed with water three times, and washed with methanol three times and dried. The solid was dissolved in monochlorobenzene, active carbon was added, and the solution was agitated for 30 minutes, and the solution was filtered through a silica gel. The remaining amount of monochlorobenzene was removed to provide a white solid. The solid was filtered to provide a compound represented by Chemical Formula 3 in 5.8 g (yield: 78.3%).

The obtained compound for an organic photoelectric device was analyzed by an atomic analyzer, and the results (in Atomic %) are as follows:

Calculated: C, 86.02; H, 4.86; N, 9.12.

Found: C, 86.03; H, 4.85; N, 9.12.

Example 2

Synthesis of Compound Represented by Chemical Formula 7

The compound represented by Chemical Formula 7 was synthesized in accordance with the following Reaction Scheme 2.

[Reaction Scheme 2]

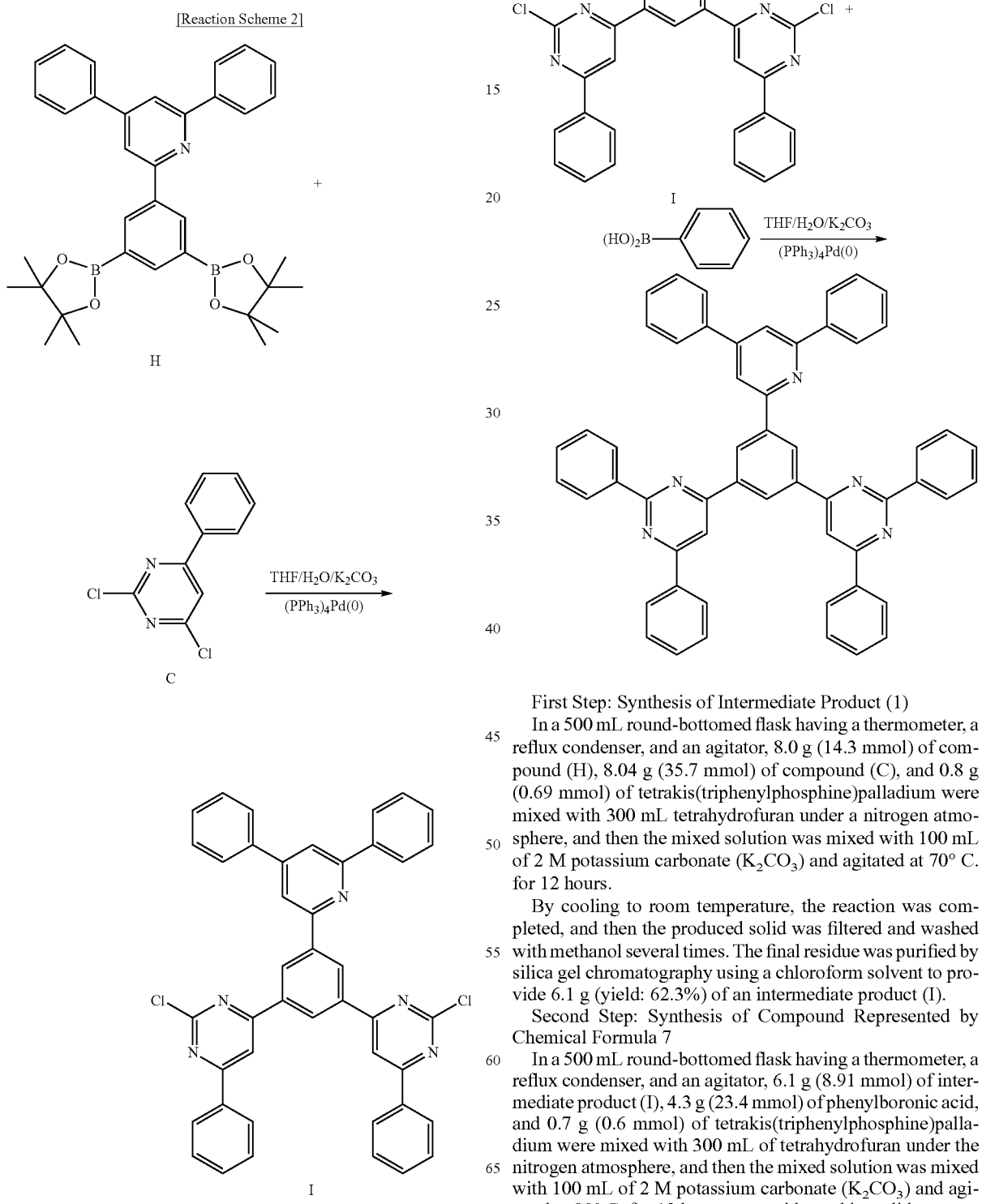

First Step: Synthesis of Intermediate Product (I)

In a 500 mL round-bottomed flask having a thermometer, a reflux condenser, and an agitator, 8.0 g (14.3 mmol) of compound (H), 8.04 g (35.7 mmol) of compound (C), and 0.8 g (0.69 mmol) of tetrakis(triphenylphosphine)palladium were mixed with 300 mL tetrahydrofuran under a nitrogen atmosphere, and then the mixed solution was mixed with 100 mL of 2 M potassium carbonate ($K_2CO_3$) and agitated at 70° C. for 12 hours.

By cooling to room temperature, the reaction was completed, and then the produced solid was filtered and washed with methanol several times. The final residue was purified by silica gel chromatography using a chloroform solvent to provide 6.1 g (yield: 62.3%) of an intermediate product (I).

Second Step: Synthesis of Compound Represented by Chemical Formula 7

In a 500 mL round-bottomed flask having a thermometer, a reflux condenser, and an agitator, 6.1 g (8.91 mmol) of intermediate product (I), 4.3 g (23.4 mmol) of phenylboronic acid, and 0.7 g (0.6 mmol) of tetrakis(triphenylphosphine)palladium were mixed with 300 mL of tetrahydrofuran under the nitrogen atmosphere, and then the mixed solution was mixed with 100 mL of 2 M potassium carbonate ($K_2CO_3$) and agitated at 80° C. for 12 hours to provide a white solid.

By cooling to room temperature, the reaction was completed, and the potassium carbonate solution was removed, and a white solid was filtered. The filtered white solid was washed with tetrahydrofuran three times, washed with water three times, and washed with methanol three times and dried. The solid was dissolved in monochlorobenzene, active carbon was added, and the solution was agitated for 30 minutes, and the solution was filtered through a silica gel. The remaining amount of monochlorobenzene was removed to provide a white solid. The solid was filtered to provide a compound represented by Chemical Formula 7 in 5.1 g (yield: 74.5%).

The obtained compound for an organic photoelectric device was analyzed by an atomic analyzer, and the results (in Atomic %) are as follows:

Calculated: C, 86.02; H, 4.86; N, 9.12.

Found: C, 86.06; H, 4.84; N, 9.10.

Example 3

Synthesis of compound represented by Chemical Formula 11

The compound represented by Chemical Formula 11 was synthesized in accordance with the following Reaction Scheme 3.

[Reaction Scheme 3]

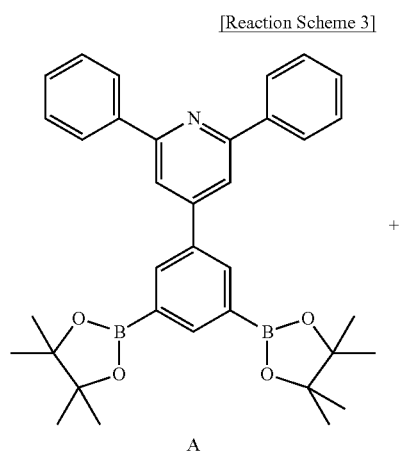

A

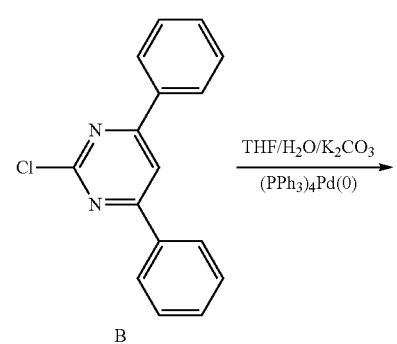

B

THF/H₂O/K₂CO₃
(PPh₃)₄Pd(0)

-continued

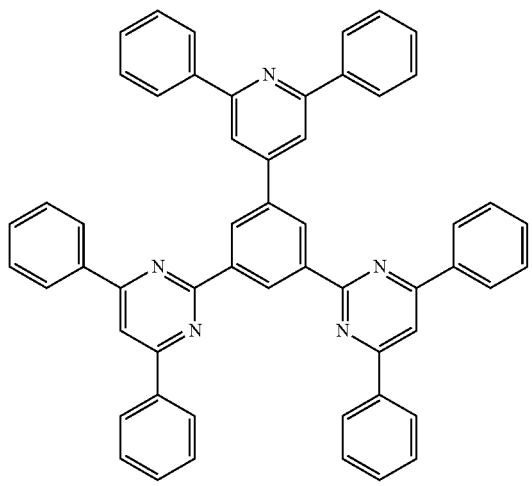

First Step: Synthesis of the Compound Represented by Chemical Formula 11

In a 500 mL round-bottomed flask having a thermometer, a reflux condenser, and an agitator under the nitrogen atmosphere, 6.0 g (10.72 mmol) of compound (A), 6.58 g (24.67 mmol) of compound (B), and 0.8 g (0.69 mmol) of tetrakis(triphenylphosphine)palladium were mixed with 300 mL of tetrahydrofuran, and then the mixed solution was mixed with 100 mL of 2 M potassium carbonate ($K_2CO_3$) and agitated at 80° C. for 12 hours to provide a white solid.

By cooling to room temperature, the reaction was completed, and then the potassium carbonate solution was removed to filter the white solid. The filtered white solid was washed with tetrahydrofuran three times, washed with water three times, and washed with methanol three times and dried. The solid was dissolved in monochlorobenzene, active carbon was added, and the solution was agitated for 30 minutes, and the solution was filtered through a silica gel. The remaining amount of monochlorobenzene was removed to provide a white solid. The solid was filtered to provide a compound represented by Chemical Formula 11 in 7.1 g (yield: 86.2%).

The obtained compound for an organic photoelectric device was analyzed by an atomic analyzer, and the results (in Atomic %) are as follows:

Calculated: C, 86.02; H, 4.86; N, 9.12.

Found: C, 86.01; H, 4.87; N, 9.12.

Example 4

Synthesis of Compound Represented by Chemical Formula 14

The compound represented by Chemical Formula 14 was synthesized in accordance with the following Reaction Scheme 4.

[Reaction Scheme 4]

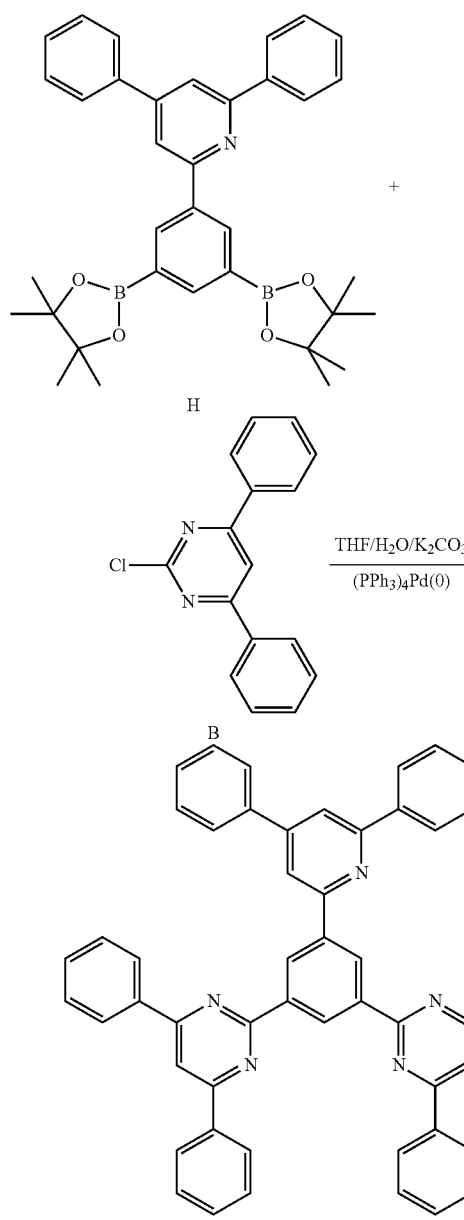

First Step: Synthesis of Compound Represented by Chemical Formula 14

In a 500 mL round-bottomed flask having a thermometer, a reflux condenser, and an agitator, 6.0 g (10.72 mmol) of compound (H), 6.58 g (24.67 mmol) of compound (B), and 0.8 g (0.69 mmol) of tetrakis(triphenylphosphine)palladium were mixed with 300 mL of tetrahydrofuran under the nitrogen atmosphere, and the mixed solution was mixed with 100 mL of 2 M potassium carbonate ($K_2CO_3$) and agitated at 80° C. for 12 hours to provide a white solid.

By cooling to room temperature, the reaction was completed, and then the potassium carbonate was removed to filter the white solid. The filtered white solid was washed with tetrahydrofuran three times, washed with water three times, and washed with methanol three times and dried. The solid was dissolved in monochlorobenzene, active carbon was added, and the solution was agitated for 30 minutes, and the solution was filtered through a silica gel. The remaining amount of monochlorobenzene was removed to provide a white solid. The solid was filtered to provide a compound represented by Chemical Formula 14 in 6.9 g (yield: 83.8%).

The obtained compound for an organic photoelectric device was analyzed by an atomic analyzer, and the results (in Atomic %) are as follows:

Calculated: C, 86.02; H, 4.86; N, 9.12.

Found: C, 86.03; H, 4.87; N, 9.10.

Example 5

Synthesis of Compound Represented by Chemical Formula 19

The compound represented by Chemical Formula 19 was synthesized in accordance with the following Reaction Scheme 5.

[Reaction Scheme 5]

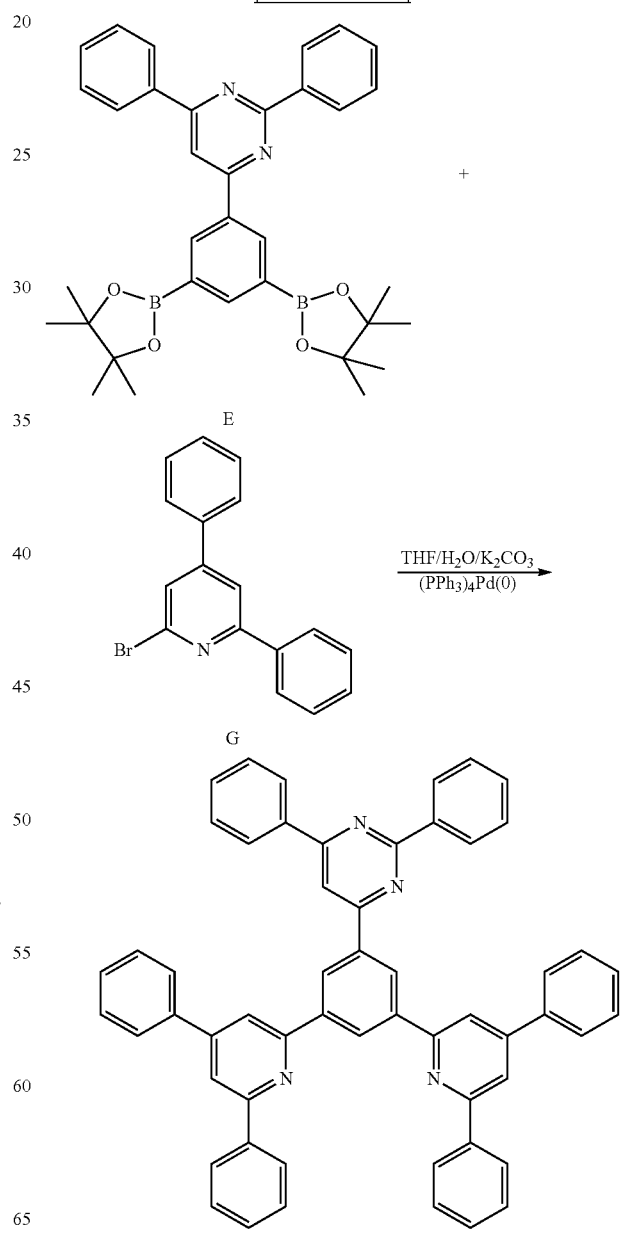

First Step: Synthesis of Compound Represented by Chemical Formula 19

In a 500 mL round-bottomed flask having a thermometer, a reflux condenser, and an agitator, 6.0 g (10.7 mmol) of compound (E), 7.63 g (24.6 mmol) of compound (G), and 0.8 g (0.69 mmol) of tetrakis(triphenylphosphine)palladium were mixed with 300 mL of tetrahydrofuran under the nitrogen atmosphere, and then the mixed solution was mixed with 100 mL of 2 M potassium carbonate ($K_2CO_3$) and agitated at 80° C. for 12 hours to provide a white solid.

By cooling to room temperature, the reaction was completed, and then the potassium carbonate solution was removed to provide the white solid. The provided white solid was washed with tetrahydrofuran three times, washed with water three times, and washed with methanol three times and dried. The solid was dissolved in monochlorobenzene, active carbon was added, and the solution was agitated for 30 minutes, and the solution was filtered through a silica gel. The remaining amount of monochlorobenzene was removed to provide a white solid. The solid was filtered to provide a compound represented by Chemical Formula 19 in 7.3 g (yield: 88.9%).

The obtained compound for an organic photoelectric device was analyzed by an atomic analyzer, and the results (in Atomic %) are as follows:

Calculated: C, 87.70; H, 4.99; N, 7.31.
Found: C, 87.72; H, 4.97; N, 7.31.

Example 6

Synthesis of Compound Represented by Chemical Formula 21

The compound represented by Chemical Formula 21 was synthesized in accordance with the following Reaction Scheme 6.

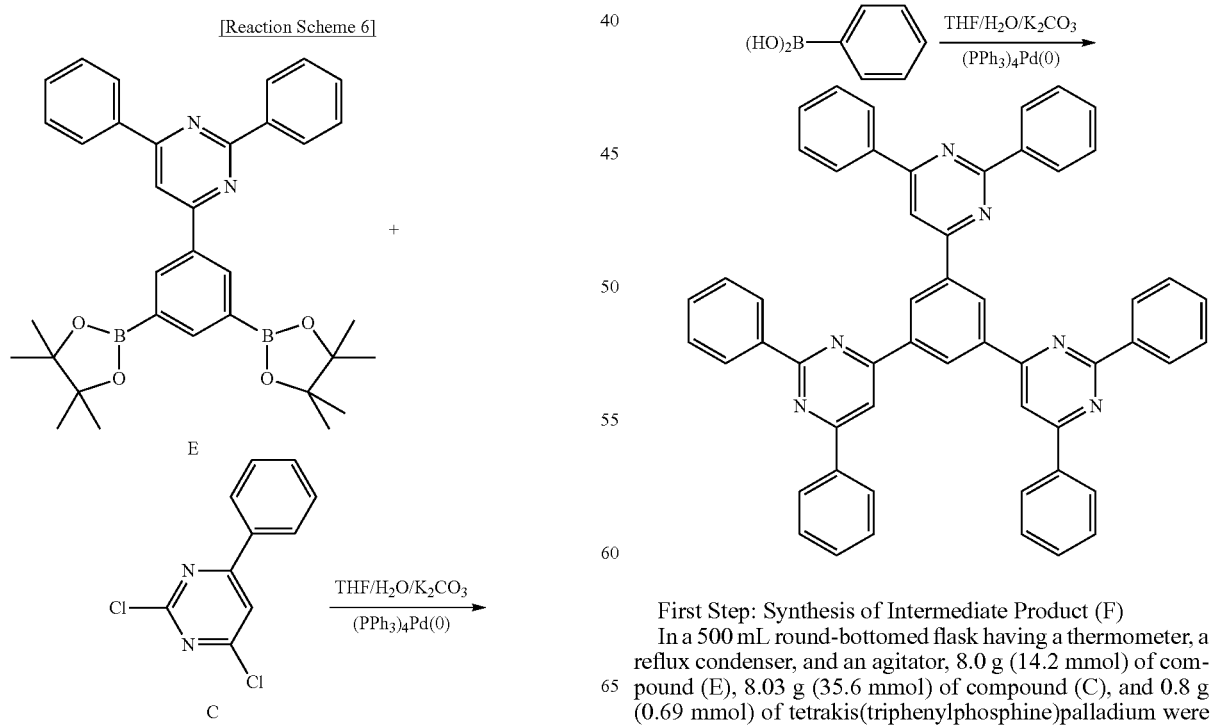

First Step: Synthesis of Intermediate Product (F)

In a 500 mL round-bottomed flask having a thermometer, a reflux condenser, and an agitator, 8.0 g (14.2 mmol) of compound (E), 8.03 g (35.6 mmol) of compound (C), and 0.8 g (0.69 mmol) of tetrakis(triphenylphosphine)palladium were mixed with 300 mL of tetrahydrofuran under the nitrogen atmosphere, and then the mixed solution was mixed with 100 mL of 2 M potassium carbonate (K₂CO₃) and agitated at 70° C. for 12 hours.

By cooling to room temperature, the reaction was completed, and then the produced solid was filtered and washed with methanol several times. The final residue was purified by silica-gel chromatography using a chloroform solvent to provide an intermediate product (F) in 6.8 g (yield: 69.8%).

Second Step: Synthesis of Compound Represented by Chemical Formula 21

In a 500 mL round-bottomed flask having a thermometer, a reflux condenser, and an agitator, 6.8 g (9.91 mmol) of intermediate product (F) synthesized in the first step, 4.54 g (24.7 mmol) of phenylboronic acid, and 0.7 g (0.6 mmol) of tetrakis(triphenylphosphine)palladium were mixed with 300 mL of tetrahydrofuran under the nitrogen atmosphere, and the mixed solution was mixed with 100 mL of 2 M potassium carbonate (K₂CO₃) and agitated at 80° C. for 12 hours to provide a white solid.

By cooling to room temperature, the reaction was completed, and the potassium carbonate solution was removed to provide a white solid. The provided white solid was washed with tetrahydrofuran three times, washed with water three times, and washed with methanol three times and dried. The solid was dissolved in monochlorobenzene, active carbon was added, and the solution was agitated for 30 minutes, and the solution was filtered through a silica gel. The remaining amount of monochlorobenzene was removed to provide a white solid. The solid was filtered to provide a compound represented by Chemical Formula 21 in 5.3 g (yield: 69.5%).

The obtained compound for an organic photoelectric device was analyzed by an atomic analyzer, and the results (in Atomic %) are as follows:

Calculated: C, 84.35; H, 4.72; N, 10.93.
Found: C, 84.37; H, 4.70; N, 10.93.

The synthesized materials were measured for a glass transition temperature and a thermal decomposition temperature by DSC and TGA.

Fabrication of Organic Photoelectric Device

Example 7

An ITO glass (120 nm) substrate having sheet resistance of 15 Ω/cm² was cut to a size of 50 mm×50 mm×0.7 mm, ultrasonic wave cleaning was performed in isopropylalcohol and pure water for 5 minutes each, and UV ozone cleaning was performed for 30 minutes to provide an anode.

DNTPD (40 nm), N,N'-di(1naphthyl)N,N' diphenylbenzidine (NPB, 10 nm), and EB46 (e-ray blue 46): EB512 (e-ray blue 512) 4% (40 nm) were sequentially thermally vacuum-deposited to form a hole injection layer (HIL), a hole transport layer, and an emission layer, sequentially.

By adjusting the deposition speed of the dopant, the dopant was deposited in a mixture amount of 4 wt % based on total amount of 100 wt % of the emission layer.

According to the same thermal vacuum deposition condition, an electron transport layer (ETL) was provided on the upper part of the emission layer in a thickness of 30 nm using the compound synthesized from Example 1 and LiQ at a weight ratio of 1:1.

According to the same thermal vacuum deposition condition, LiQ (0.5 nm) and Al (100 nm) were sequentially deposited as a negative electrode on the upper part of the electron transport layer (ETL) to provide an organic light emitting diode.

Comparative Example 1

An organic light emitting diode was fabricated in accordance with the same procedure as in Example 7, except that the compound represented by Chemical Formula 34 and LiQ (weight ratio of 1:1) were used to provide an electron transport layer (ETL) instead of using the compound synthesized from Example 1 and LiQ (weight ratio of 1:1).

[Chemical Formula 34]

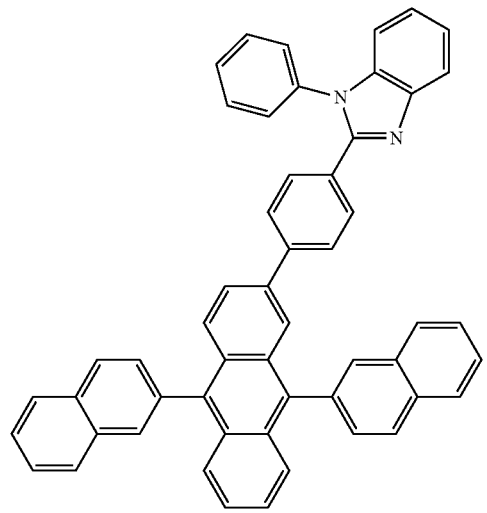

Measurement of performance of organic photoelectric device

Measurement Method

Each of the obtained organic photoelectric devices was measured for luminance change, current density change depending upon the voltage, and luminous efficiency. The specific method was as follows.

1) Measurement of current density change depending on voltage change

The obtained organic photoelectric device was measured for current value flowing in the unit device while increasing the voltage from 0V to 14V using a current-voltage meter (Keithley 2400), and the measured current value was divided by area to provide the result.

2) Measurement of luminance change depending on voltage change

The obtained organic photoelectric device was measured for luminance using a luminance meter (Minolta Cs1000A) while increasing the voltage.

3) Measurement of luminous efficiency

Current efficiency (cd/A) and electric power efficiency (1 m/W) at the same luminance (1000 cd/m2) were calculated by using the luminance and current density change depending on voltage change from 1) and 2) above. The results are shown in the following Table 1.

4) Color coordinate was measured by a luminance meter (Minolta Cs100A), and the results are shown in the following Table 1.

TABLE 1

| Devices | Measurement at 1000 cd/m² | | | |
| --- | --- | --- | --- | --- |
| | Driving voltage (V) | Current efficiency (cd/A) | Electric power efficiency (lm/W) | Color coordinate (x, y) |
| Example 7 | 3.8 | 10.81 | 8.94 | 0.15, 0.19 |
| Comparative Example 1 | 4.4 | 7.65 | 5.46 | 0.15, 0.20 |

Referring to Table 1, the results of evaluating the characteristics of the organic light emitting diode show that the organic light emitting diode obtained from Example 7 had lower driving voltage than the organic light emitting diode of Comparative Example 1. Also, the current efficiency and the electric power efficiency were improved in Example 7 such that the device performance was improved. It is confirmed that the compound synthesized from the Examples decreased the driving voltage of organic light emitting diode and improved the luminance efficiency (i.e., current efficiency and electric power efficiency).

From the results, organic photoelectric devices including the compound for an organic photoelectric device may show a low driving voltage and high luminous efficiency, and thus the life span of the device may be increased.

By way of summary and review, examples of an organic photoelectric device may include one selected from the group of an organic light emitting diode, an organic solar cell, an organic photo conductor drum, and an organic transistor. The organic photoelectric device may include at least one of a hole injecting or transporting material, an electron injecting or transporting material, and a light emitting material.

Particularly, as an organic photoelectric device, an organic light emitting diode (OLED) may be used in a display device (e.g., a flat panel display). Organic light emission may refer to the transformation of electrical energy to photo-energy.

Such an organic photoelectric device may transform electrical energy into light by applying current to an organic light emitting material. It may have a structure in which a functional organic material layer is interposed between an anode and a cathode. The organic material layer may include a multi-layer of different materials, for example a hole injection layer (HIL), a hole transport layer (HTL), an emission layer, an electron transport layer (ETL), and an electron injection layer (EIL). At least one of these layers may improve efficiency and stability of an organic photoelectric device.

In such an organic photoelectric device, when a voltage is applied between an anode and a cathode, holes from the anode and electrons from the cathode may be injected to an organic material layer and may recombined to generate excitons having high energy. The generated excitons may generate light having certain wavelengths while shifting to a ground state.

A phosphorescent light emitting material may be used for a light emitting material of an organic light emitting diode in addition to the fluorescent light emitting material. Such a phosphorescent material may emit light by transitioning the electrons from a ground state to an exited state, non-radiance transitioning of a singlet exciton to a triplet exciton through intersystem crossing, and transitioning a triplet exciton to a ground state to emit light.

As described above, in an organic light emitting diode, an organic material layer may include a light emitting material and a charge transport material, for example a hole injection material, a hole transport material, an electron transport material, an electron injection material, and so on.

The light emitting material may be classified as blue, green, yellow, orange, and red light emitting materials according to the emitted colors.

When one material is used as a light emitting material, a maximum light emitting wavelength may be shifted to a long wavelength or color purity may decrease because of interactions between molecules, or device efficiency may decrease because of a light emitting quenching effect. Therefore, a host/dopant system may be included as a light emitting material in order to improve color purity and increase luminous efficiency and stability through energy transfer.

In order to implement improved performance of an organic photoelectric device, a material constituting an organic material layer (for example a hole injection material, a hole transport material, a light emitting material, an electron transport material, an electron injection material, and a light emitting material such as a host and/or a dopant) may be desired to have improved stability and efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic photoelectric device, the compound being represented by Chemical Formula 2:

[Chemical Formula 2]

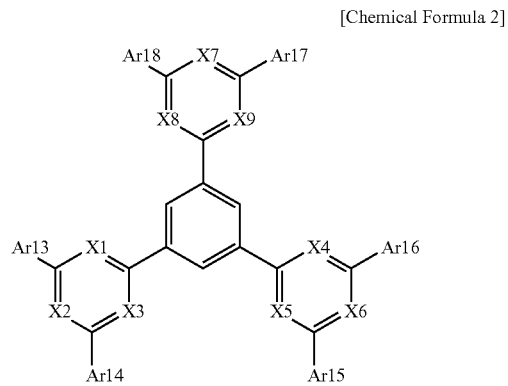

wherein, in Chemical Formula 2,
X1 to X9 are each independently a heteroatom or CR, wherein R is selected from the group of hydrogen, a C1 to C30 alkyl group, and a C6 to C30 aryl group,
at least one of X1 to X9 is CR, at least two of X1 to X3 are a heteroatom, at least one of X4 to X6 is a heteroatom, and at least one of X7 to X9 is a heteroatom; and
Ar13 to Ar18 are each independently a substituted or unsubstituted C6 to C30 aryl group.

2. The compound for an organic photoelectric device as claimed in claim 1, wherein at least two of X4 to X6 are a heteroatom.

3. The compound for an organic photoelectric device as claimed in claim 1, wherein the compound represented by Chemical Formula 2 is selected from the group of:
   a compound where X2, X3, X5, X6, and X7 are heteroatoms, and the remainder of X1 to X9 are CR; and
   a compound where X2, X3, X5, X6, and X9 are heteroatoms, and the remainder of X1 to X9 are CR.

4. The compound for an organic photoelectric device as claimed in claim 1, wherein the compound represented by Chemical Formula 2 is selected from the group of:
   a compound where X2, X3, X5, X6, X7, and X9 are heteroatoms, and the remainder of X1 to X9 are CR;
   a compound where X2, X3, X5, X6, X8, and X9 are heteroatoms, and the remainder of X1 to X9 are CR;
   a compound where X1, X3, X4, X5, X8, and X9 are heteroatoms, and the remainder of X1 to X9 are CR; and
   a compound where X1, X3, X4, X5, X7, and X9 are heteroatoms, and the remainder of X1 to X9 are CR.

5. The compound for an organic photoelectric device as claimed in claim 1, wherein the compound represented by Chemical Formula 2 is selected from the group of:
   a compound where X2, X3, X5, X6, X7, X8, and X9 are heteroatoms, and the remainder of X1 to X9 are CR; and
   a compound where X1, X3, X4, X5, X7, X8, and X9 are heteroatoms, and the remainder of X1 to X9 are CR.

6. The compound for an organic photoelectric device as claimed in claim 1,
   wherein, in Chemical Formula 2,
   Ar13 to Ar18 are each independently selected from the group of a phenyl group, a biphenyl group, a terphenyl group, a stilbenyl group, a naphthyl group, an anthracenyl group, a phenanthrenyl group, a pyrenyl group, and a perylenyl group.

7. A compound for an organic photoelectric device, the compound being represented by one of Chemical Formulae 3 to 33:

[Chemical Formula 3]

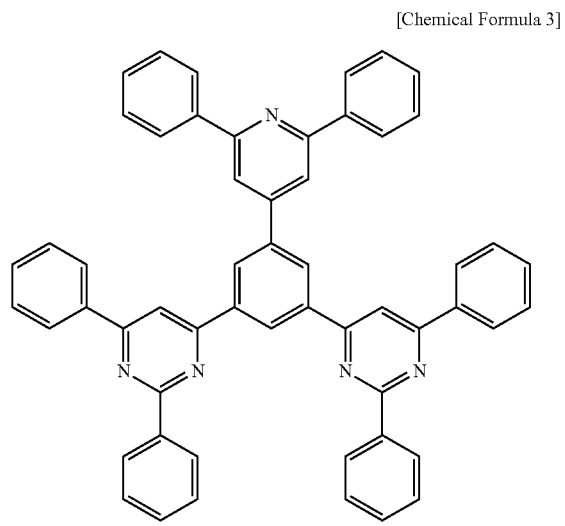

[Chemical Formula 4]

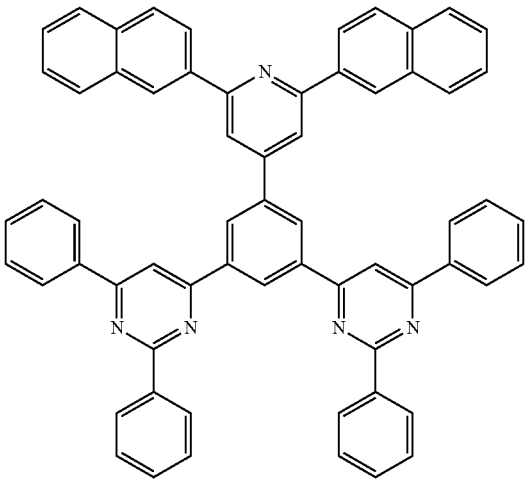

[Chemical Formula 5]

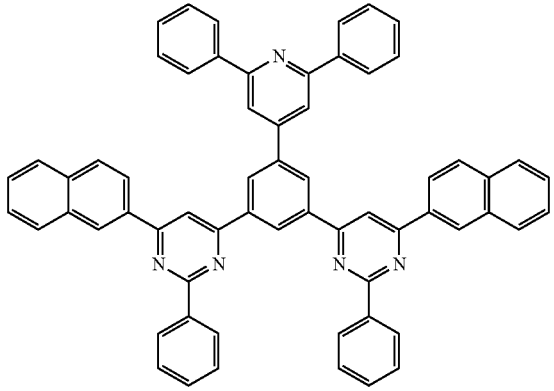

[Chemical Formula 6]

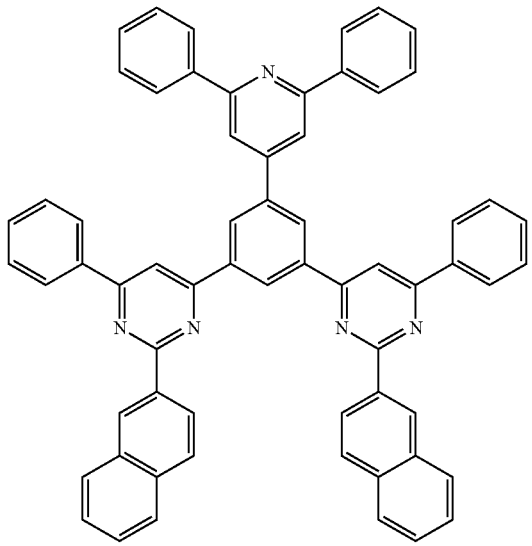

[Chemical Formula 7]
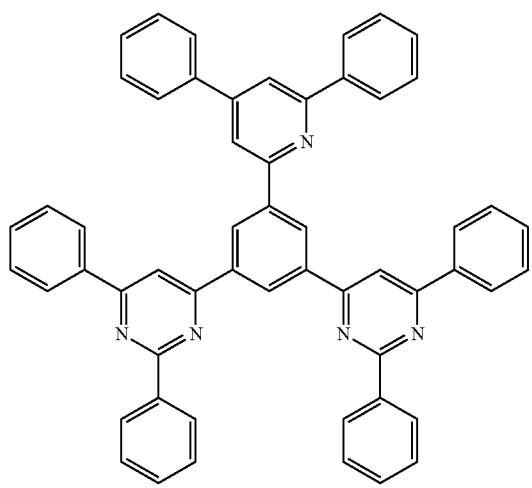
[Chemical Formula 8]
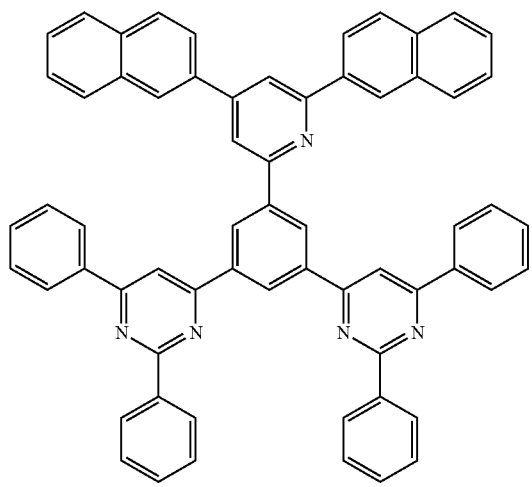
[Chemical Formula 9]
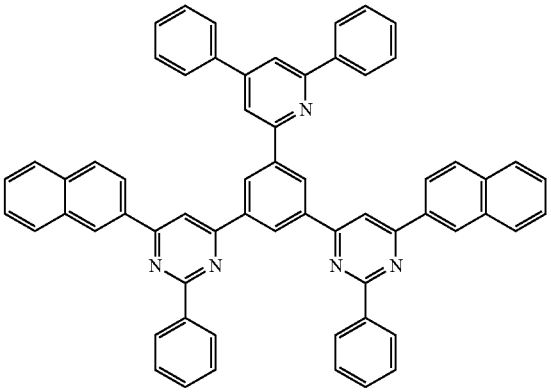
[Chemical Formula 10]
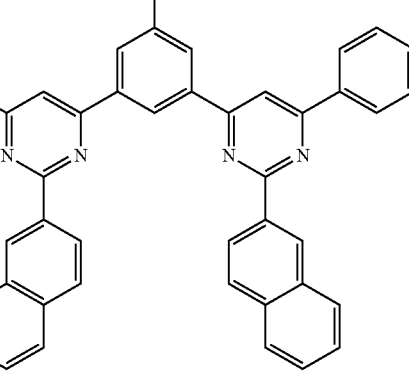
[Chemical Formula 11]
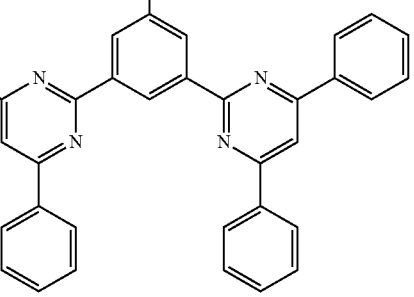
[Chemical Formula 12]
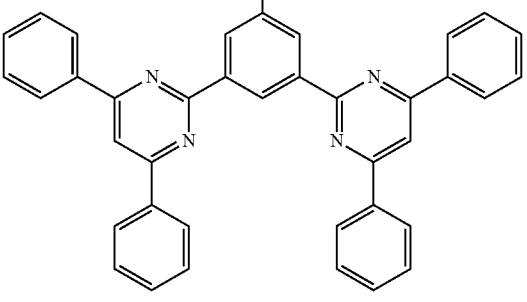

[Chemical Formula 13]
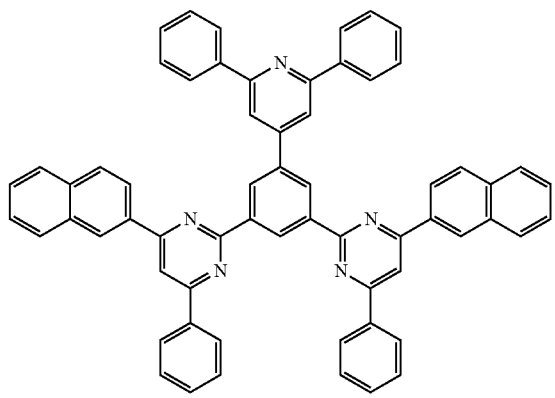
[Chemical Formula 14]
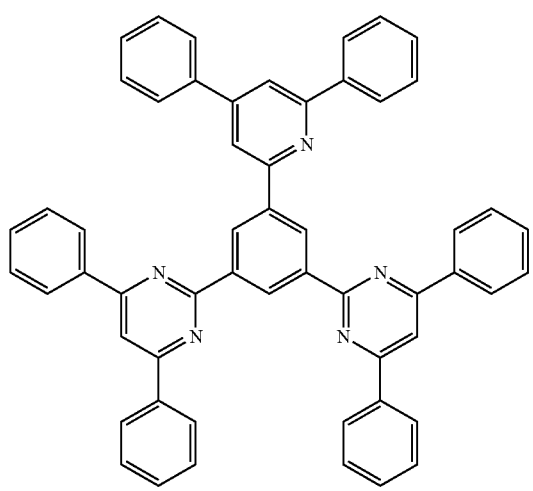
[Chemical Formula 15]
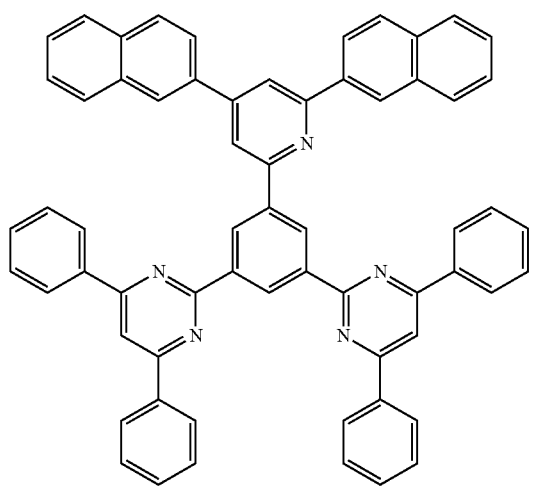
[Chemical Formula 16]
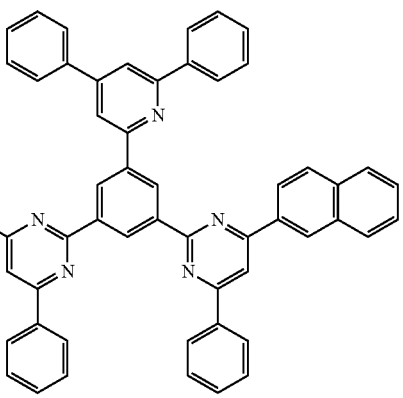
[Chemical Formula 17]
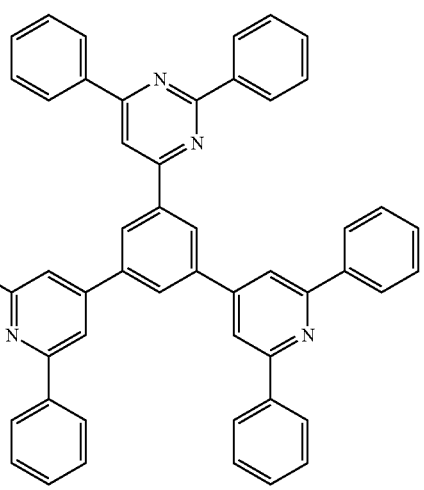
[Chemical Formula 18]
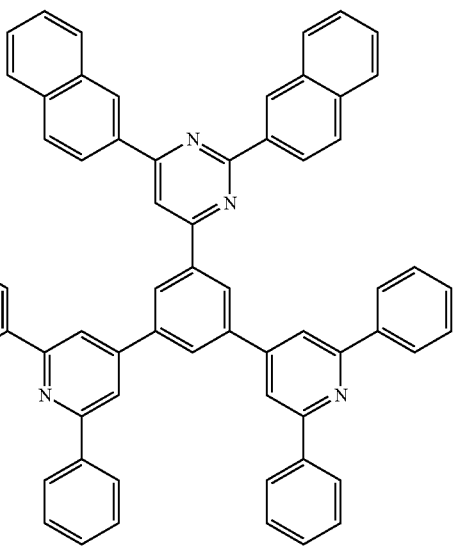

[Chemical Formula 19]
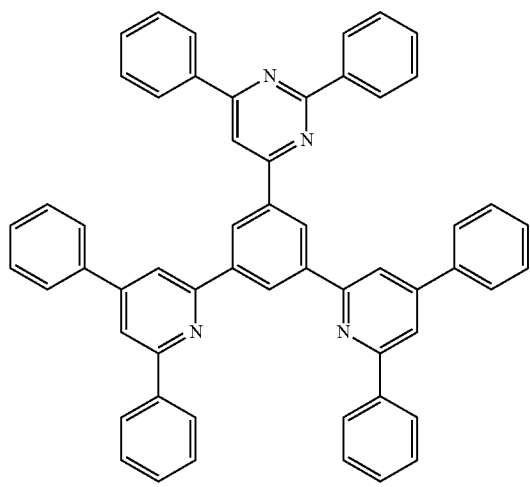
[Chemical Formula 20]
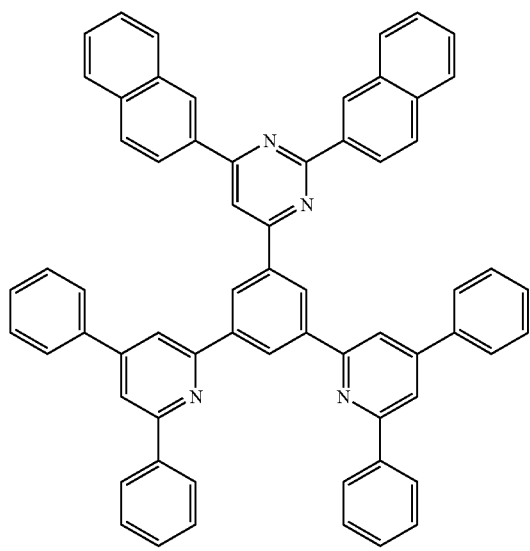
[Chemical Formula 21]
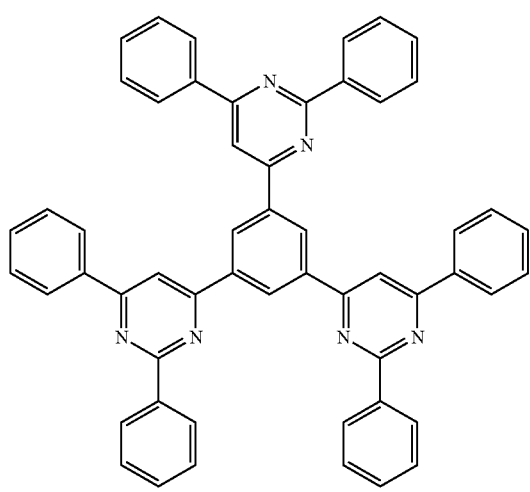
[Chemical Formula 22]
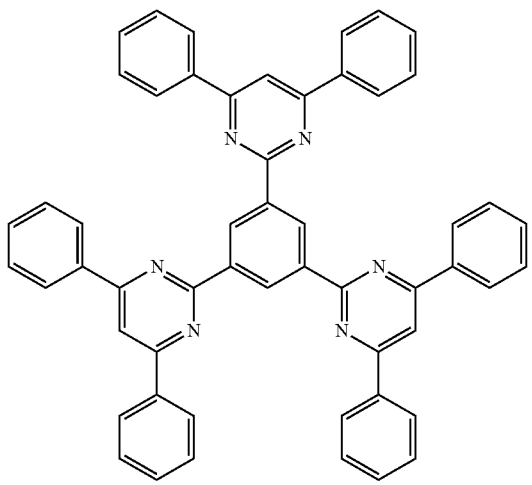
[Chemical Formula 23]
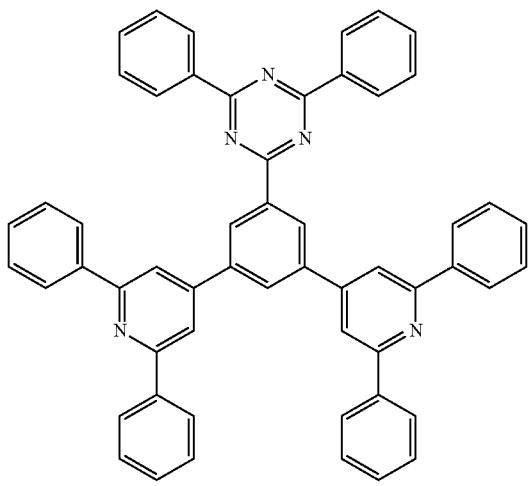
[Chemical Formula 24]
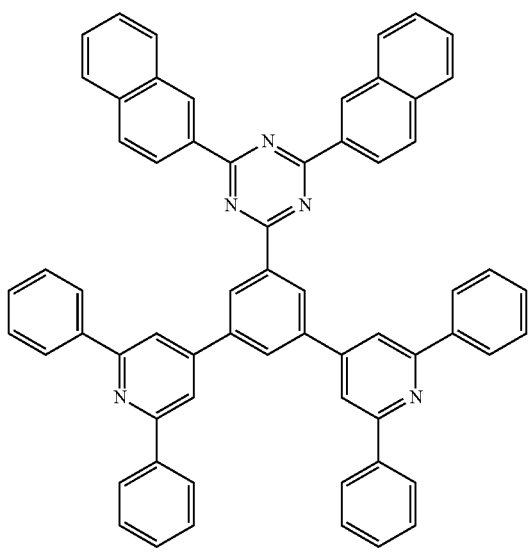

[Chemical Formula 25]
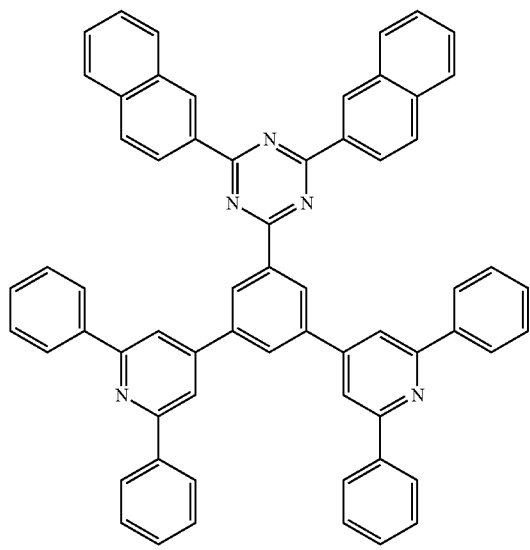
[Chemical Formula 26]
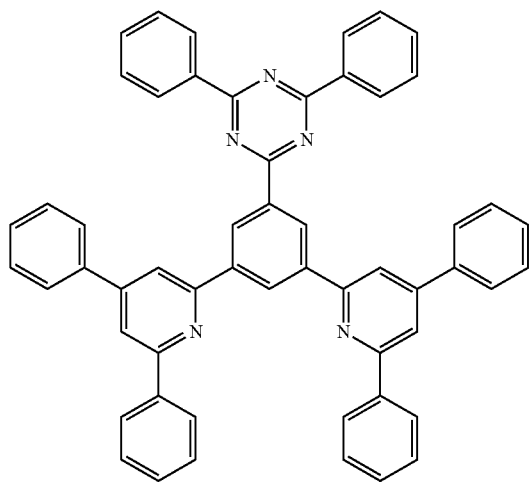
[Chemical Formula 27]
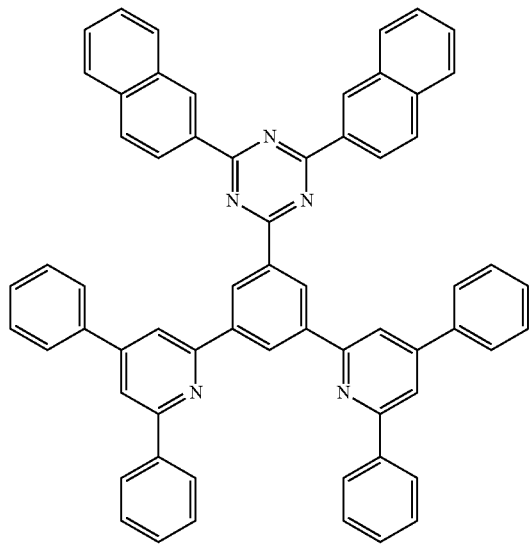
[Chemical Formula 28]
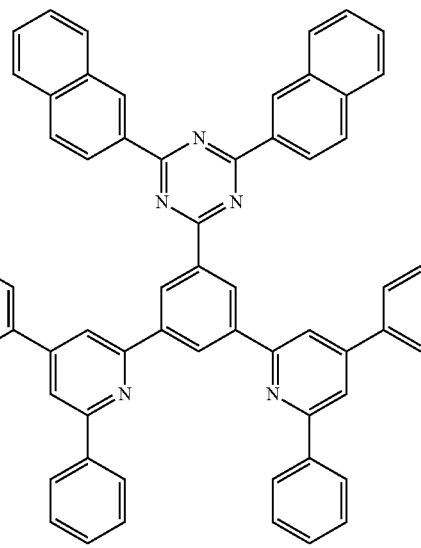
[Chemical Formula 29]
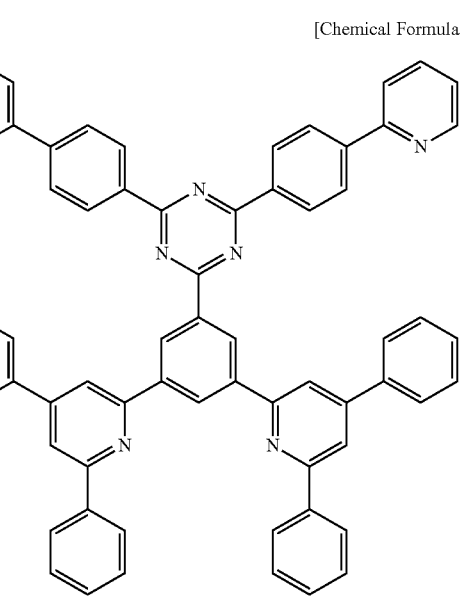

[Chemical Formula 30]

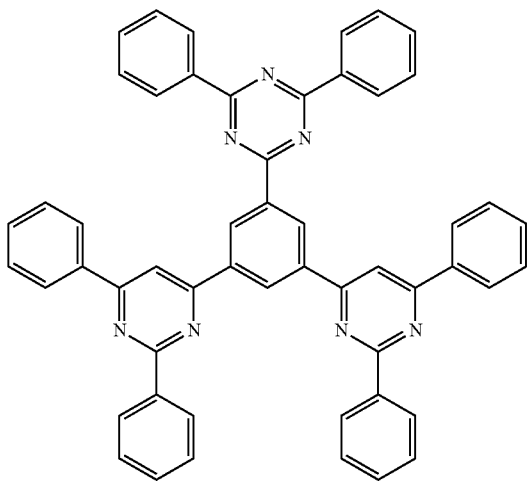

[Chemical Formula 31]

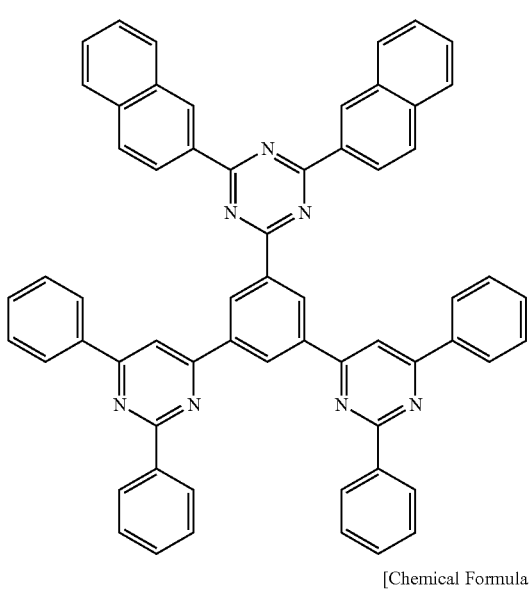

[Chemical Formula 32]

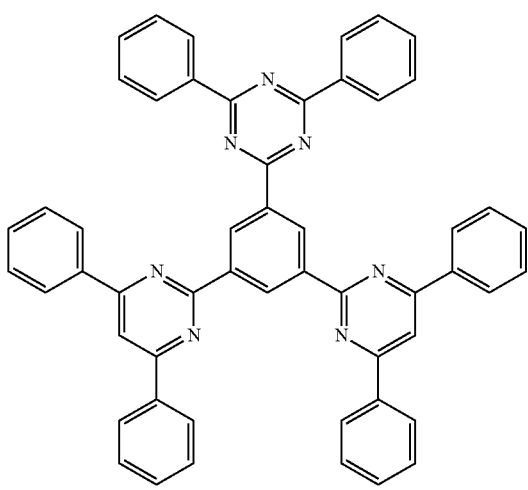

[Chemical Formula 33]

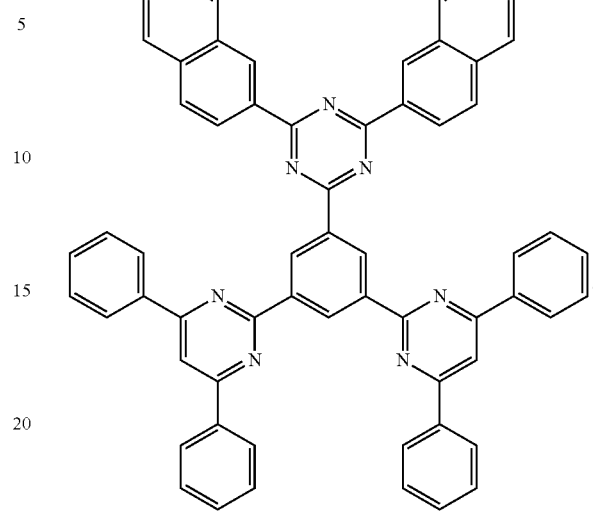

8. An organic photoelectric device, comprising:
an anode, a cathode, and an organic thin layer between the anode and the cathode,
wherein the organic thin layer includes the compound for an organic photoelectric device according to claim 1.

9. The organic photoelectric device as claimed in claim 8, wherein the organic thin layer includes one selected from the group of an emission layer, a hole transport layer (HTL), a hole injection layer (HIL), an electron transport layer (ETL), an electron injection layer (EIL), a hole blocking layer, and a combination thereof.

10. The organic photoelectric device as claimed in claim 8, wherein the compound for an organic photoelectric device is included in an electron transport layer (ETL) or an electron injection layer (EIL).

11. The organic photoelectric device as claimed in claim 8, wherein the compound for an organic photoelectric device is included in an emission layer.

12. The organic photoelectric device as claimed in claim 8, wherein the compound for an organic photoelectric device is used as a phosphorescent or fluorescent host material in an emission layer.

13. The organic photoelectric device as claimed in claim 8, wherein the compound for an organic photoelectric device is used as a fluorescent blue dopant material in an emission layer.

14. The organic photoelectric device as claimed in claim 8, wherein the organic photoelectric device is selected from the group of an organic light emitting diode, an organic solar cell, an organic transistor, an organic photo conductor drum, and an organic memory device.

15. A display device including the organic photoelectric device as claimed in claim 8.

16. An organic photoelectric device, comprising:
an anode, a cathode, and an organic thin layer between the anode and the cathode,
wherein the organic thin layer includes the compound for an organic photoelectric device according to claim 7.

* * * * *